(12) United States Patent
Yamada et al.

(10) Patent No.: US 12,342,429 B2
(45) Date of Patent: Jun. 24, 2025

(54) LIGHT-EMITTING DEVICE AND DRIVING METHOD FOR LIGHT-EMITTING DEVICE

(71) Applicant: SHARP KABUSHIKI KAISHA, Sakai (JP)

(72) Inventors: Hirohisa Yamada, Sakai (JP); Yoshihiro Ueta, Sakai (JP); Masumi Kubo, Sakai (JP); Masaki Yamamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 332 days.

(21) Appl. No.: 18/016,766

(22) PCT Filed: Jul. 29, 2020

(86) PCT No.: PCT/JP2020/028977
§ 371 (c)(1),
(2) Date: Jan. 18, 2023

(87) PCT Pub. No.: WO2022/024239
PCT Pub. Date: Feb. 3, 2022

(65) Prior Publication Data
US 2023/0284473 A1  Sep. 7, 2023

(51) Int. Cl.
*H05B 33/26* (2006.01)
*H05B 33/14* (2006.01)
(Continued)

(52) U.S. Cl.
CPC .......... *H05B 33/26* (2013.01); *H05B 33/145* (2013.01); *H10K 50/16* (2023.02); *H10K 50/19* (2023.02);
(Continued)

(58) Field of Classification Search
None
See application file for complete search history.

(56) References Cited

U.S. PATENT DOCUMENTS 8,120,242 B2 * 2/2012 Yokoyama ............. B82Y 10/00
313/504
8,431,448 B2 * 4/2013 Obata ..................... H10K 50/30
438/149

(Continued)

FOREIGN PATENT DOCUMENTS

JP   2012169266 A   9/2012
JP   2016149191 A   8/2016

(Continued)

OTHER PUBLICATIONS

Website of Flicker Health Management Co., Ltd., online, searched on Apr. 28, 2020, Internet<http://www.fhm.co.jp/fhm/fhmsystem.html>; A concise explanation of the relevance can be found in paragraphs [0004], [0062] of the specification of the subject application.

*Primary Examiner* — Srinivas Sathiraju
(74) *Attorney, Agent, or Firm* — ScienBiziP, P.C.

(57) ABSTRACT

In a light-emitting device, a first electrode, a light-emitting layer, and a second electrode are disposed in the order recited. Moreover, a charge transport layer is disposed between the first electrode and the light-emitting layer and/or between the second electrode and the light-emitting layer. A third electrode at least partly overlaps the light-emitting layer. Moreover, the third electrode is disposed between the charge transport layer and the light-emitting layer.

17 Claims, 26 Drawing Sheets

(51) Int. Cl.
  *H10K 50/16* (2023.01)
  *H10K 50/19* (2023.01)
  *H10K 50/805* (2023.01)
  *H10K 50/824* (2023.01)

(52) U.S. Cl.
  CPC ......... *H10K 50/805* (2023.02); *H10K 50/824* (2023.02)

(56) References Cited

U.S. PATENT DOCUMENTS

| | | | | |
|---|---|---|---|---|
| 11,626,568 | B1* | 4/2023 | Price | H10K 59/122 257/40 |
| 2002/0048964 | A1* | 4/2002 | Yuasa | H10H 20/0137 438/791 |
| 2009/0108749 | A1* | 4/2009 | Yokoyama | H10K 50/30 257/E29.183 |
| 2010/0090202 | A1* | 4/2010 | Obata | H10K 50/30 438/45 |
| 2012/0007039 | A1* | 1/2012 | Ueta | H01L 21/0262 438/479 |
| 2012/0112318 | A1 | 5/2012 | Yokoyama et al. | |
| 2013/0037779 | A1* | 2/2013 | Takeoka | H10H 20/8215 438/36 |
| 2013/0134388 | A1* | 5/2013 | Ueda | H10H 20/811 438/47 |
| 2016/0233275 | A1 | 8/2016 | Toyoda | |
| 2016/0343903 | A1* | 11/2016 | Ueta | H10H 20/815 |
| 2018/0083173 | A1* | 3/2018 | Yamamoto | H10H 20/857 |
| 2021/0057662 | A1* | 2/2021 | Handa | H05B 33/14 |
| 2023/0157061 | A1* | 5/2023 | Bilodeau | H10K 50/856 257/40 |
| 2023/0217775 | A1* | 7/2023 | Kim | H10K 59/351 257/91 |
| 2023/0284473 | A1* | 9/2023 | Yamada | H10K 50/30 315/209 R |

FOREIGN PATENT DOCUMENTS

| | | |
|---|---|---|
| WO | 2007119490 A1 | 10/2007 |
| WO | 2008035406 A1 | 3/2008 |
| WO | 2008081936 A1 | 7/2008 |
| WO | 2015166562 A1 | 11/2015 |

* cited by examiner

FROM (STEP 3A)

(STEP 4A) SECTIONAL VIEW     TOP VIEW (a-a SECTIONAL VIEW)

(STEP 5A)

TO (STEP 6A)

<DURING LIGHT EMISSION>

<DURING CARRIER RELEASE>

<COMPARATIVE EXAMPLE>

FROM (STEP 3C)

↓

(STEP 4C)   SECTIONAL VIEW   TOP VIEW (a-a SECTIONAL VIEW)

↓

(STEP 5C)

↓

TO (STEP 6C)

<DURING LIGHT EMISSION>

<DURING CARRIER RELEASE>

FROM (STEP 3E)

⬇

(STEP 4E)

SECTIONAL VIEW

TOP VIEW

⬇

(STEP 5E)

⬇

TO (STEP 6E)

| | SECTIONAL VIEW | TOP VIEW |
|---|---|---|
| FROM (STEP 3G) ⬇ (STEP 4G) |  |  |
| ⬇ (STEP 5G) |  |  |
| ⬇ TO (STEP 6G) | | |

FROM (STEP 5G)     SECTIONAL VIEW     TOP VIEW (STEP 6G)

(STEP 7G)

LIGHT-EMITTING DEVICE AND DRIVING METHOD FOR LIGHT-EMITTING DEVICE

TECHNICAL FIELD

One aspect of the disclosure relates to a light-emitting device that includes a light-emitting layer.

SUMMARY

Background Art

Various techniques about an electro-luminescence (EL) element, which is a light-emitting device that includes a light-emitting layer, have been proposed recently. Patent Literature 1 for instance discloses an optical device that includes an organic EL (an example EL element). Patent Literature 1 describes that the lifetime of the optical device can be prolonged by adjusting the carrier balance within the light-emitting layer of the organic EL.

CITATION LIST

Patent Literature

Patent Literature 1: International Publication No. WO2008/035406A1

Non-Patent Literature

Non-Patent Literature 1: Website of Flicker Health Management Co., Ltd., online, searched on Apr. 28, 2020, Internet <http://www.fhm.co.jp/fhm/fhnmsystem-.html>

SUMMARY

Technical Problem

An EL element can accumulate excess carriers at the interface between the light-emitting layer and a carrier transport layer, the details of which will be described later on. Moreover, the excess carrier accumulation can lower the performance of the EL element. Unfortunately, the known techniques (e.g., technique in Patent Literature 1) do not particularly refer to a specific method for addressing the excess carrier accumulation.

In view of the above problem, one aspect of the disclosure aims to provide a highly reliable light-emitting device.

To solve the foregoing problem, a light-emitting device according to one aspect of the disclosure includes the following: a first electrode, a light-emitting layer, and a second electrode disposed in the order recited; a charge transport layer disposed between the first electrode and the light-emitting layer and/or between the second electrode and the light-emitting layer; and a third electrode provided so as to at least partly overlap the light-emitting layer, wherein the third electrode is disposed between the charge transport layer and the light-emitting layer.

Further, to solve the foregoing problem, a light-emitting device according to one aspect of the disclosure includes the following: a first electrode, a light-emitting layer, and a second electrode disposed in the order recited; a charge transport layer disposed between the first electrode and the light-emitting layer and/or between the second electrode and the light-emitting layer; a third electrode formed so as to at least partly overlap the light-emitting layer; a circuit for electrically connecting together a power source for driving the light-emitting layer, the first electrode, and the second electrode; a first switch for opening or closing the circuit; and a second switch for opening or closing an electrical connection between the third electrode and the circuit.

Further, to solve the foregoing problem, a light-emitting device according to one aspect of the disclosure includes the following: a first electrode, a light-emitting layer, and a second electrode disposed in the order recited, a charge transport layer disposed between the first electrode and the light-emitting layer and/or between the second electrode and the light-emitting layer; a third electrode and a fourth electrode provided so as to at least partly overlap the light-emitting layer, the third electrode being disposed between the charge transport layer and the light-emitting layer on the first electrode, the fourth electrode being disposed between the charge transport layer and the light-emitting layer on the second electrode; a circuit for electrically connecting together a power source for driving the light-emitting layer, the first electrode, and the second electrode; a first switch for opening or closing the circuit; and a second switch for opening or closing an electrical connection between the third electrode and the fourth electrode.

Further, to solve the foregoing problem, one aspect of the disclosure provides a method for driving a light-emitting device including a first electrode, a light-emitting layer, and a second electrode disposed in the order recited, the light-emitting device including a charge transport layer disposed between the first electrode and the light-emitting layer and/or between the second electrode and the light-emitting layer, the light-emitting device including a third electrode formed so as to at least partly overlap the light-emitting layer, the light-emitting device including a circuit for electrically connecting together a power source for driving the light-emitting layer, the first electrode, and the second electrode, the method including the following: a first step of opening or closing the circuit; and a second step of opening or closing an electrical connection between the third electrode and the circuit.

Further, to solve the foregoing problem, one aspect of the preset disclosure provides a method for driving a light-emitting device including a first electrode, a light-emitting layer, and a second electrode disposed in the order recited, the light-emitting device including a charge transport layer disposed between the first electrode and the light-emitting layer and/or between the second electrode and the light-emitting layer, the light-emitting device including a third electrode and a fourth electrode provided so as to at least partly overlap the light-emitting layer, the third electrode being disposed between the charge transport layer and the light-emitting layer on the first electrode, the fourth electrode being disposed between the charge transport layer and the light-emitting layer on the second electrode, the light-emitting device including a circuit for electrically connecting together a power source for driving the light-emitting layer, the first electrode, and the second electrode, the method including the following: a first step of opening or closing the circuit; and a third step of opening or closing an electrical connection between the third electrode and the fourth electrode.

Advantageous Effect of Disclosure

The aspects of the disclosure can provide a highly reliable light-emitting device.

DESCRIPTION OF EMBODIMENTS

First Embodiment

The following describes a light-emitting device 100 according to a first embodiment. The light-emitting device 100 is an example EL element. Among the components of the light-emitting device 100, the description of those irrelevant to the first embodiment will be omitted. For simplicity, the description of those similar to publicly known techniques will be omitted as appropriate.

It should be noted that each numeric value described in the Description is mere an example. Unless otherwise clearly indicated, the wording "A to B" regarding any two numerals A and B refers to "A to B inclusive" in the Description. It should be also noted that each drawing schematically illustrates the shape and structure of each component as well as their positional relationship, and that they are not necessarily drawn as scaled.

Configuration of Light Emitting Device 100

Figure 1:
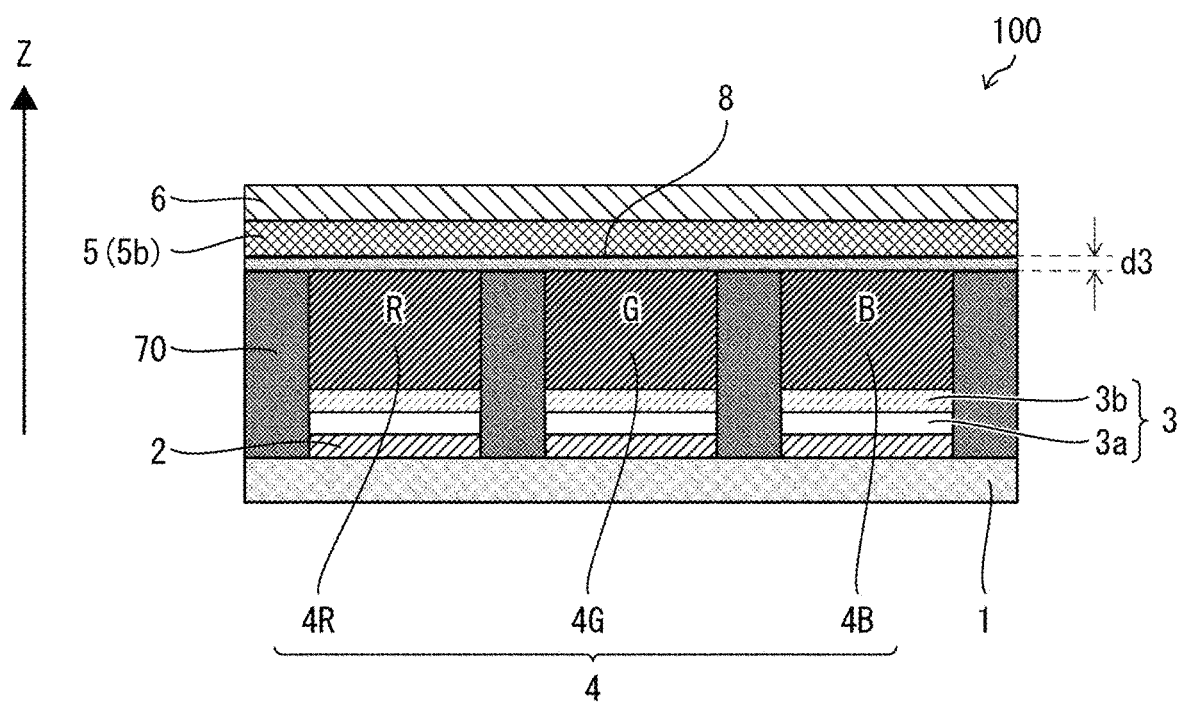
FIG. 1 illustrates the configuration of main components of a light-emitting device according to a first embodiment.

FIG. 1 illustrates the configuration of main components of the light-emitting device 100. The Description defines a direction that goes from a substrate 1, which will be described later on, toward a first electrode 2 (or a second electrode 6), which will be described later on, as an upward direction. The Description also defines a direction opposite to the upward direction as a downward direction. The Z-direction in FIG. 1 indicates an up-and-down direction. The positive direction of the Z-direction is an upward direction.

The light-emitting device 100 includes the following in the order recited from the bottom to the top: the substrate 1; the first electrode 2; a hole injection/transport layer 3; a light-emitting layer 4; an electron injection/transport layer 5; and the second electrode 6. The light-emitting device 100 further includes a third electrode 8, which will be detailed later on.

The substrate 1 is a glass substrate for instance. On the substrate 1 is a thin-film transistor (TFT) substrate not shown. The TFT substrate incorporates an array of TFTs.

The first electrode 2 is provided on the TFT substrate. The first electrode 2 contains a publicly known conductive material. The first electrode 2 in the example of FIG. 1 is an anode (positive electrode). The first electrode 2 is electrically connected to the hole injection/transport layer 3. The hole injection/transport layer 3 in the example of FIG. 1 is provided on the first electrode 2.

The hole injection/transport layer 3 generically represents a hole injection layer (HIL) and a hole transport layer (HTL). The hole injection/transport layer 3 in the example of FIG. 1 includes a hole injection layer 3a and a hole transport layer 3b in the order recited.

The light-emitting layer 4 is a layer that emits light through EL. The light-emitting layer 4 is provided on the hole transport layer 3b. The light-emitting layer 4 in the example of FIG. 1 has (i) a red light-emitting portion 4R (first light-emitting portion) that emits red light, (ii) a green light-emitting portion 4G (second light-emitting portion) that emits green light, and (iii) a blue light-emitting portion 4B (third light-emitting portion) that emits blue light. The light-emitting device 100 further includes a bank 70 formed so as to separate (space) the red light-emitting portion 4R, the green light-emitting portion 4G and the blue light-emitting portion 4B.

The red light-emitting portion 4R corresponds to a red (R) subpixel; the green light-emitting portion 4G, to a green (G) subpixel; and the blue light-emitting portion 4B, to a blue (B) subpixel. A single pixel (RGB pixel) in the light-emitting device 100 is composed of a single R-subpixel, a single G-subpixel, and a single B-subpixel.

The first embodiment describes an instance where the light-emitting layer 4 contains quantum-dot (QD) phosphor particles not shown. Accordingly, the red light-emitting portion 4R contains a red QD phosphor particle; the green light-emitting portion 4G, a green QD phosphor particle; and the blue light-emitting portion 4B, a blue QD phosphor particle.

The first embodiment describes an instance where the light-emitting device 100 is a quantum-dot light-emitting diode (QLED), as described above. Nevertheless, the light-emitting device 100 needs to bean EL element and is not necessarily limited to a QLED. The light-emitting device 100 may be an organic LED (OLED) for instance. The light-emitting layer 4 is in this case formed as an organic EL layer.

The electron injection/transport layer 5 generically represents an electron injection layer (EIL) and an electron transport layer (ETL). The electron injection/transport layer 5 in the example of FIG. 1 is provided on the third electrode 8.

Figure 4:
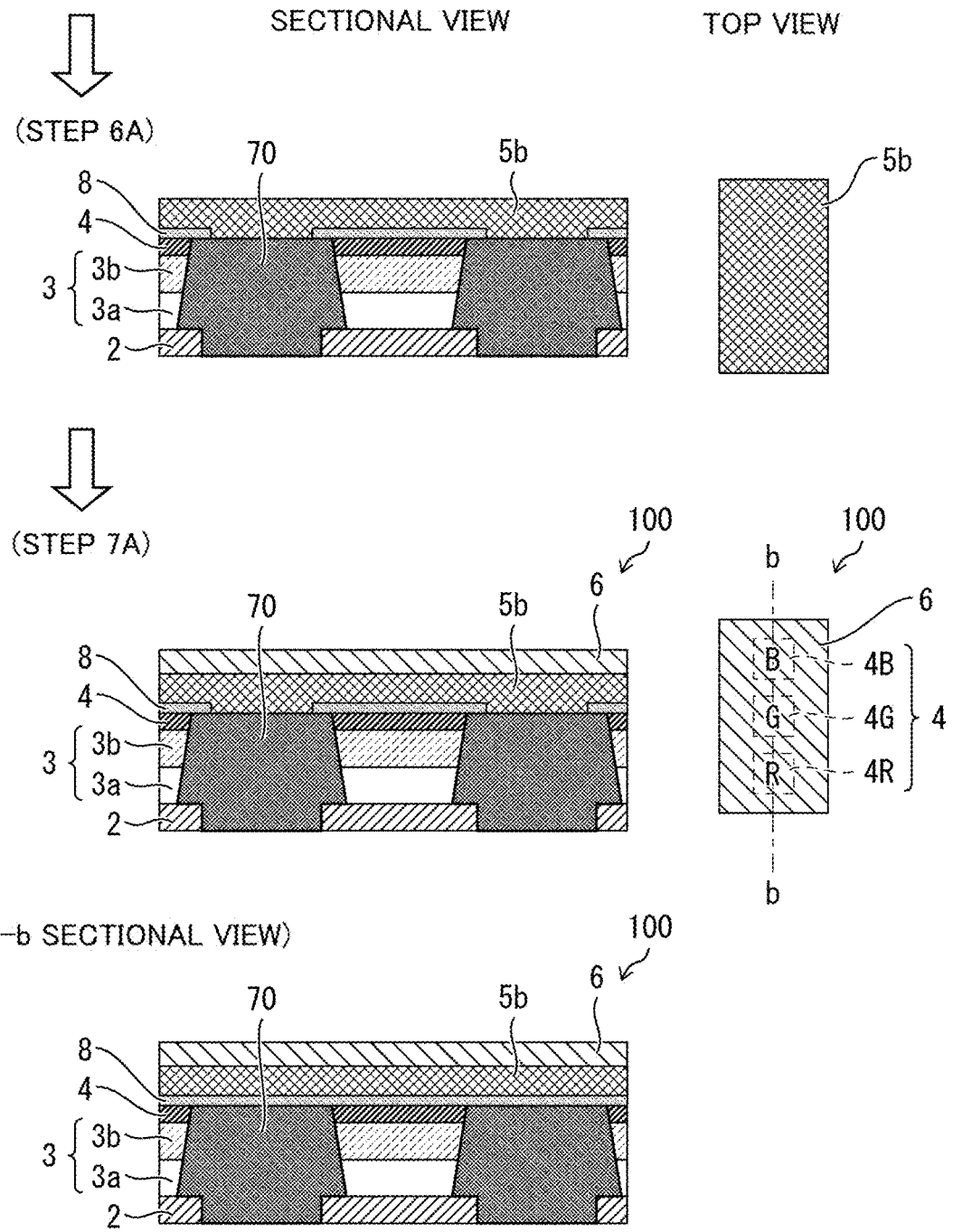
FIG. 4 illustrates process steps for manufacturing the light-emitting device according to the first embodiment.

It is noted that the Description defines the hole injection/transport layer 3 and the electron injection/transport layer 5 generically as a charge transport layer (or a carrier transport layer). The hole injection/transport layer 3 is disposed between the first electrode 2 and the light-emitting layer 4, as illustrated in FIG. 1. In contrast, the electron injection/transport layer 5 (in more detail, the electron transport layer 5b) is disposed between the second electrode 6 and the light-emitting layer 4, as illustrated in FIG. 4, which will be described later on. The charge transport layer needs to be disposed between the first electrode 2 and the light-emitting layer 4 and/or between the second electrode 6 and the light-emitting layer 4.

The second electrode 6 contains a publicly known conductive material. The second electrode 6 in the example of FIG. 1 is a cathode (negative electrode). The second electrode 6 is electrically connected to the electron injection/transport layer 5. The second electrode 6 in the example of FIG. 1 is provided on the electron injection/transport layer 5.

The third electrode 8 is disposed so as to be electrically connected to the light-emitting layer 4. The third electrode 8 needs to be disposed between the charge transport layer and the light-emitting layer 4. The third electrode 8 in the example of FIG. 1 is disposed so as to be in contact with the light-emitting layer 4. To be more specific, the third electrode 8 is provided on the light-emitting layer 4. The third electrode 8 covers at least a part of the bank 70, as illustrated in FIG. 1. It is noted that d3 in FIG. 1 denotes the thickness (film thickness) of the third electrode 8.

The material of the third electrode 8 (third-electrode material) is a publicly known conductive material. The third-electrode material may be, for instance, a conductive material having light transparency. A preferable example of the third-electrode material is a compound containing at least titanium dioxide ($TiO_2$) or aluminum zinc oxide (AZO). The third electrode 8 is thus composed of, for instance, a compound containing at least $TiO_2$ or AZO.

Examples of the third-electrode material include (i) $TiO_2$, (ii) a compound with $TiO_2$ partly replaced with niobium, and (iii) AZO. The third-electrode material in the first embodiment is a compound with $TiO_2$ partly replaced with niobium. It is noted that the resistivity of the compound is about $10^{-4}$ Ω·cm.

It is preferable that d3 be 5 to 20 nm. Following (1) and (2) are the reasons.

(1) For the third electrode 8 to have in-plane conductivity, d3 is preferably set to a large size to a certain degree (e.g., 5 nm or greater). When d3 is excessively small (e.g., less than 5 nm), film formation using the third-electrode material possibly offers the third electrode 8 in the form of an island. It is difficult for the third electrode 8 in this case to have in-plane conductivity.

(2) When d3 is excessively large (e.g., greater than 20 nm), carrier injection into the light-emitting layer 4 is possibly difficult. When d3 is not excessively large (e.g., less than 20 nm) in contrast, a tunnel current or other things enables carrier injection into the light-emitting layer 4.

Process Steps for Manufacturing Light Emitting Device 100

Figure 2:
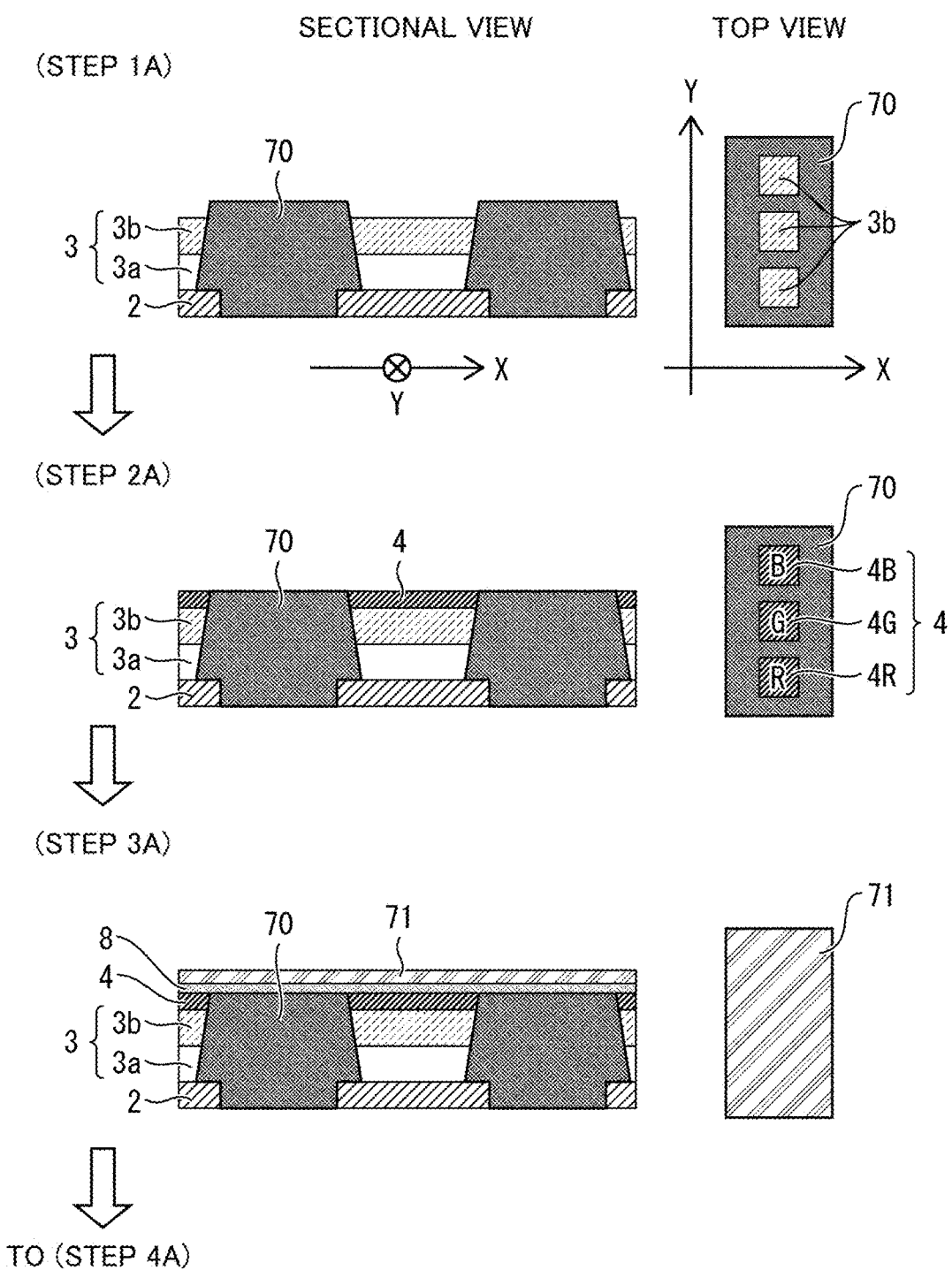
FIG. 2 illustrates process steps for manufacturing the light-emitting device according to the first embodiment.
Figure 3:
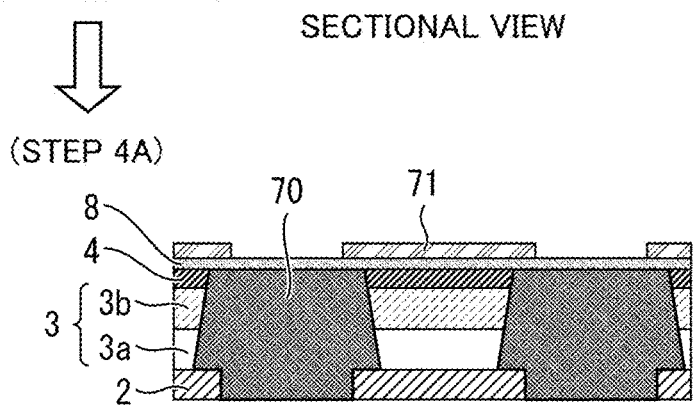
FIG. 3 illustrates process steps for manufacturing the light-emitting device according to the first embodiment.
Figure 3:
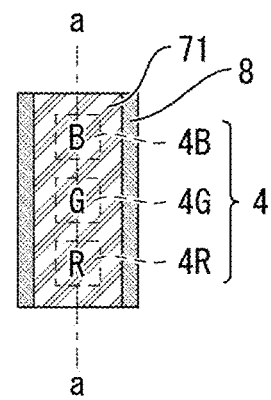
Figure 3:
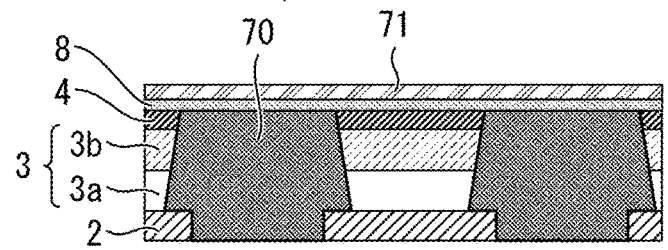
Figure 3:
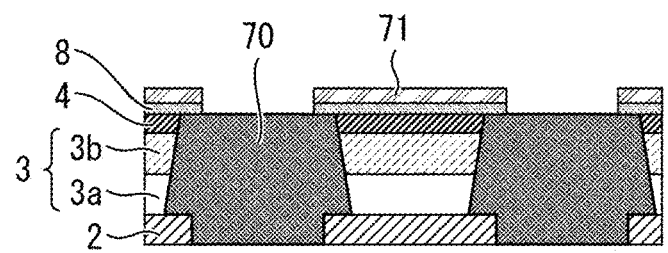
Figure 3:
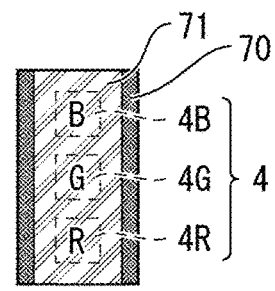

FIG. 2 to FIG. 4 illustrate process steps (Steps 1A through 7A) for manufacturing the light-emitting device 100. FIG. 2 illustrates Steps 1A through 3A; FIG. 3, Steps 4A through 5A; and FIG. 4, Steps 6A through 7A. FIG. 2 to FIG. 4 illustrate the light-emitting device 100 in each process step in its sectional and top views. It is noted that the illustration of the substrate 1 is omitted in FIG. 2 to FIG. 4.

The light-emitting device 100 according to the first embodiment is manufactured in such manner that the red light-emitting portion 4R, the green light-emitting portion 4G, and the blue light-emitting portion 4B are repeatedly arranged in a first direction in the order recited. The Y-direction (the up-and-down direction of the drawing sheet in the top view) in FIG. 2 to FIG. 4 is one example of the first direction. The Y-direction in the first embodiment is parallel to the substrate 1. The Y-direction in FIG. 2 to FIG. 4 are orthogonal to the foregoing Z-direction and an X-direction described below.

Further, the light-emitting device 100 according to the first embodiment is manufactured in such a manner that a plurality of red light-emitting portions 4R, a plurality of green light-emitting portions 4G, and a plurality of blue light-emitting portions 4B are arranged in a second direction (see also FIG. 8, which will be described later on). The second direction is a direction intersecting with the first direction. The X-direction (the side-to-side direction of the drawing sheet in the top view) in FIG. 2 to FIG. 4 is one example of the second direction. The X-direction in FIG. 2 to FIG. 4 are orthogonal to the Z-direction and the Y-direction. The X-direction in the first embodiment is parallel to the substrate 1. As such, the first embodiment describes, by way of example, an XYZ rectangular coordinate system for convenience in description. Nevertheless, it should be noted that the positional relationship between the individual components of the light-emitting device 100 is not limited to the XYZ rectangular coordinate system illustrated in the first embodiment. For instance, the first direction and the second direction do not have to be necessarily parallel to the substrate 1. The first direction and the second direction do not also have to be necessarily orthogonal.

Step 1A

The first process step is forming the first electrode 2 (anode) onto a TFT substrate not shown. The first electrode 2 is formed through evaporation and sputtering for instance. The third electrode 8 and the second electrode 6 are formed similarly.

The bank 70 is formed after the first electrode 2 is formed. The bank 70 is made of polyimide for instance. The bank 70 has a width (bank width) of 1 to 1.5 μm for instance. The hole injection/transport layer 3 is then formed onto the first electrode 2 after the bank 70 is formed. To be specific, the first process step is forming the hole injection layer 3a onto the first electrode 2. The next is forming the hole transport layer 3b onto the hole injection layer 3a.

The hole injection/transport layer 3 may be formed through evaporation and sputtering by way of example. Alternatively, the hole injection/transport layer 3 may be formed by applying a colloidal solution containing a hole injection material and/or a hole transport material. Examples of the hole injection material and/or the hole transport material include poly(ethylenedioxythiophene)/polystyrene-sulfonate (PEDOT:PSS) and poly((9,9-dioctylfluorenyl-2,7-diyl)-co-(4,4-(N-(4-s-butylphenyl))diphenyl-amine) (TFB).

Step 2A

The light-emitting layer 4 (to be more specific, the red light-emitting portion 4R, the green light-emitting portion 4G, and the blue light-emitting portion 4B) is formed onto the hole injection/transport layer 3 through a publicly known film formation method. The red light-emitting portion 4R, the green light-emitting portion 4G, and the blue light-emitting portion 4B are spaced by the bank 70.

Step 3A

The third electrode 8 is formed onto the light-emitting layer 4. A resist 71 (to be more specific, a photoresist) is then formed onto the third electrode 8 after the third electrode 8 is formed.

Step 4A

The resist 71 is removed selectively. Step 4A includes removing a part of the resist 71 deposited on the bank 70. That is, the resist 71 undergoes partial removal in a width narrower than the bank width. The resist 71 undergoes this removal through photolithography for instance. For reference, FIG. 3 illustrates Step 4A further in a sectional view taken along line a-a in its top view.

Step 5A

The third electrode 8 is removed selectively. Step 5A includes removing a part of the third electrode 8 in the same width as the range of removal of the resist 71 in Step 4A. The third electrode 8 is removed through ashing for instance. It is noted that the bank 70, if damaged by the ashing, causes no problem. This is because that the bank 70 is a component that does not get involved in the EL of the light-emitting layer 4.

Step 6A

The remaining resist 71 is removed after Step 5A is completed. The electron transport layer 5b is then formed after the resist 71 is removed. The electron transport layer 5b covers the upper surfaces of the third electrode 8 and bank 70, as illustrated in FIG. 4. The electron transport layer 5b in FIG. 4 is one example of the electron injection/transport layer 5.

The electron transport layer 5b may be formed through evaporation and sputtering by way of example. Alternatively, the electron transport layer 5b may be formed by applying a colloidal solution containing nanoparticles of an electron transport material. An example of the material of the nanoparticles is ZnO.

Step 7A

The second electrode 6 is formed onto the electron transport layer 5b. It is noted that the electron transport layer 5b on the bank 70 may be removed selectively, as necessary, through ashing for instance, before the second electrode 6 is formed. For reference, FIG. 4 illustrates Step 7A further in a sectional view taken along line b-b in its top view.

Drive Circuit 90

Figure 5:
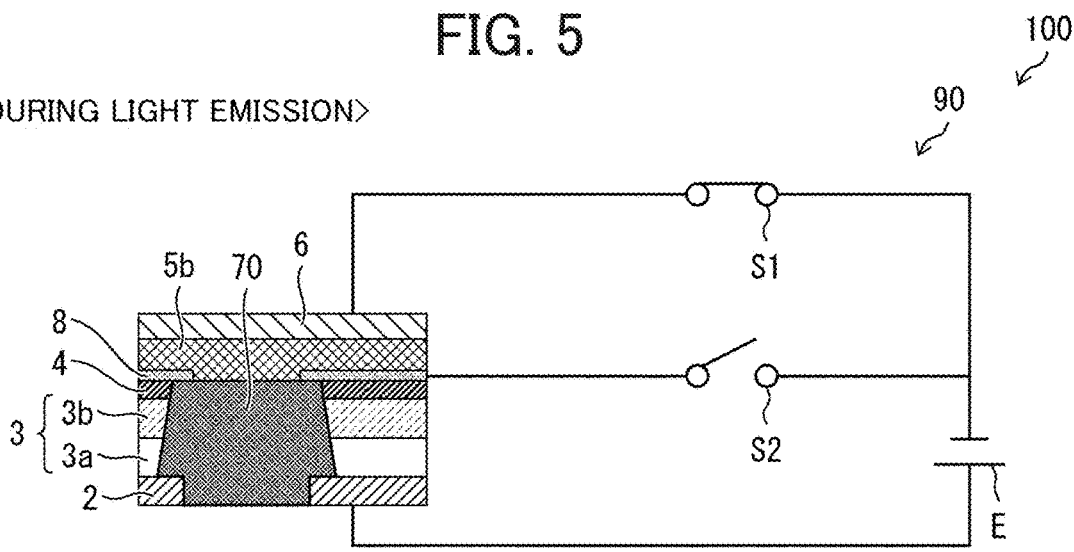
FIG. 5 illustrates the relationship between a drive circuit and first to third electrodes in the first embodiment.
Figure 5:
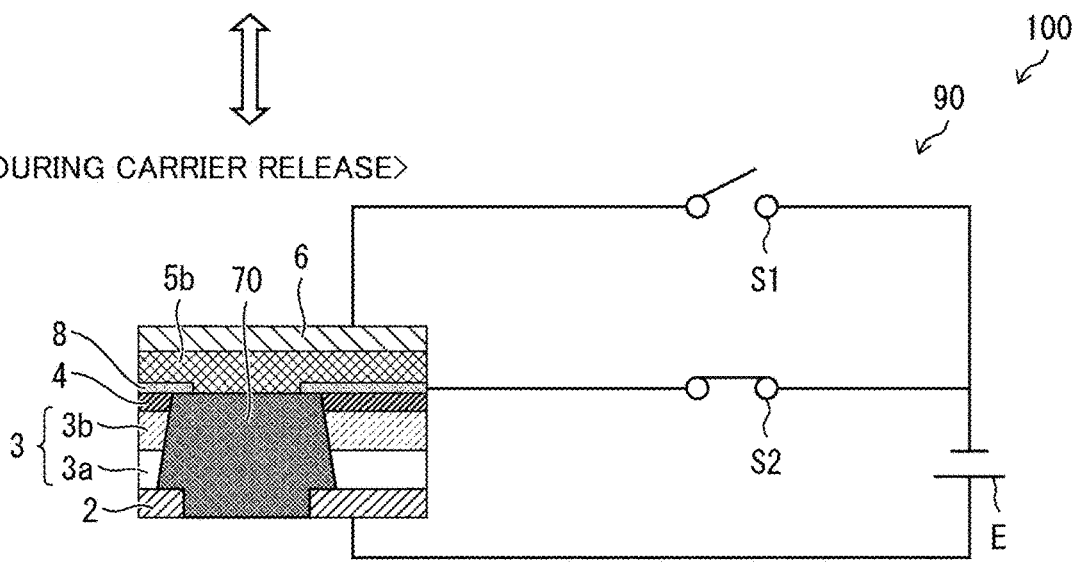

The light-emitting device 100 preferably further includes a drive circuit 90 for driving the light-emitting layer 4 (for emission control). FIG. 5 illustrates the relationship between the drive circuit 90 and the first to third electrodes. The drive circuit 90 includes a power source E, a switch S1 (first switch), and a switch S2 (second switch), as illustrated in FIG. 5. The switch S1 for instance will be hereinafter abbreviated merely as S1.

The power source E is a power source (e.g., DC power source) for driving the light-emitting layer 4. The power source E in the light-emitting device 100 has a positive electrode electrically connected to the anode (first electrode 2). The power source E has a negative electrode electrically connected to the cathode (second electrode 6). The negative electrode of the power source E is also electrically connected to the third electrode 8 via S2. The drive circuit 90 according to the first embodiment includes a switching control circuit (not shown) that controls opening or closing of each switch.

The drive circuit 90 has a main circuit that electrically connects together the power source E, the first electrode 2, and the second electrode 6. S1 is a switch for opening or closing the main circuit. The power source E, the first electrode 2, and the second electrode 6 are electrically connected together when S1 is ON (closed), as illustrated in DURING LIGHT EMISSION in FIG. 5. This enables the light-emitting layer 4 to emit light. It is noted that S2 is OFF (open) during light emission, as illustrated in FIG. 5. The third electrode 8 is thus not electrically connected to the main circuit during light emission.

The switch S2 is a switch for switching (opening or closing) the electrical connection between the third electrode 8 and the main circuit. The third electrode 8 and the main circuit are electrically connected together when S2 is ON, as illustrated in DURING CARRIER RELEASE in FIG. 5. It is noted that S1 is OFF during carrier release. As described, the light-emitting layer 4 is stopped from light emission during carrier release. As described later on, excess carriers accumulated in the light-emitting layer 4 can be conceivably released during carrier release.

For convenience, where S1 is ON and S2 is OFF will be hereinafter referred also to as a first state (or a light emission state). In contrast, where S1 is OFF and S2 is ON will be hereinafter referred also to as a second state (or a carrier release state). Alternate change between the opening and closing of each of S1 and S2 enables switching between the first state and the second state.

It is noted that the process step of opening or closing the main circuit in a method for driving the light-emitting device according to one aspect of the disclosure is referred also to as a first step. In contrast, the process step of opening or closing the electrical connection between the third electrode 8 and the main circuit is referred also to a second step. The switching between the first state and the second state can be regarded as the switching between the first step and the second step.

Comparative Example

A comparative example will be described prior to the description of effects of the light-emitting device 100. The light-emitting device according to the comparative example is one example of a known light-emitting device (to be more specific, an EL element). The light-emitting device according to the comparative example has no third electrode, unlike the light-emitting device 100. It is thus not possible in the comparative example, unlike the light-emitting device 100, to switch between the first state and the second state.

Figure 6:
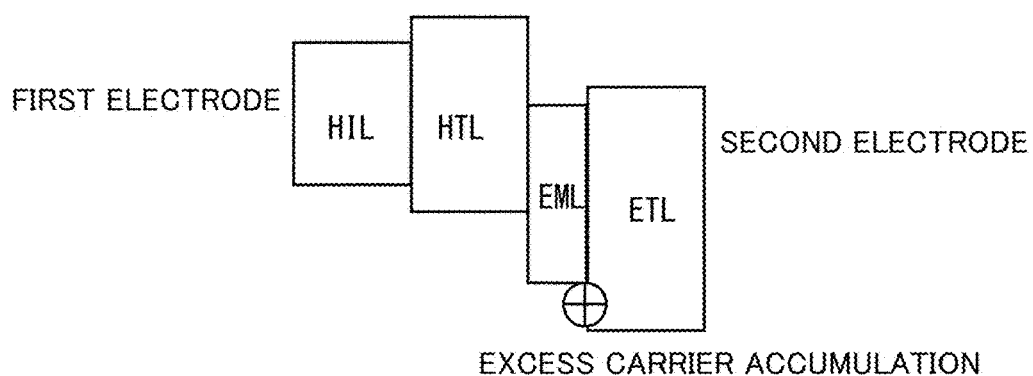
FIG. 6 illustrates a comparative example.

FIG. 6 illustrates the comparative example. It is noted that EML in FIG. 6 denotes a light-emitting layer. A typical light-emitting device (EL element) is configured such that the first electrode and the second electrode are brought into electrical connection to thus inject carriers into the light-emitting layer, thus causing the light-emitting layer to emit light. Hence, excess carriers can accumulate at the interface between the light-emitting layer and the carrier transfer layer during the light emission of the light-emitting device. FIG. 6 illustrates an instance where excess carriers, which are herein holes, accumulate at the interface between the EML and the ETL.

An accumulation of excess carriers causes the light-emitting layer to lose its carrier injection balance, thus possibly lowering the performance of the light-emitting device (e.g., reduction in light emission efficiency and reduction in luminance). Further, these accumulated excess carriers can possibly degrade the light-emitting layer or a function layer (e.g., the carrier transport layer) adjacent to the light-emitting layer.

Switching Between First State and Second State in Light-Emitting Device 100

Referring to FIG. 5 again, the switching between the first state and the second state in the light-emitting device 100 will be described. Unlike the light-emitting device according to the comparative example, the light-emitting device 100 has the third electrode 8 between the light-emitting layer 4 (EML) and the electron transport layer 5b (ETL), as illustrated in FIG. 5.

The first electrode 2 and the second electrode 6 are electrically connected together in the first state, as illustrated in DURING LIGHT EMISSION in FIG. 5. Hence in the first state, excess carriers, which are herein holes, can accumulate at the interface between the light-emitting layer 4 and the third electrode 8 (the interface of the light-emitting layer 4 adjacent to the electron transport layer 5b).

The first electrode 2 and the second electrode 6 are not electrically connected together in the second state by contrast, as illustrated in DURING CARRIER RELEASE in FIG. 5. The first electrode 2 and the third electrode 8 are instead electrically connected together in the second state. Hence, the excess carriers (holes) accumulated at the foregoing interface of the light-emitting layer 4 can be conceivably released via the third electrode 8 and S2 in the second state.

It is noted that the third electrode 8 in the foregoing example referring to FIG. 5 is formed of the same material (e.g., $TiO_2$) as the electron transport layer 5b. It is also noted that the third electrode 8 is 5 to 20 nm thick. The third electrode 8 in this case (i) has the same function as the electron transport layer 5b in the first state and (ii) serves as an electrode in the second state.

Effect

As described above, the light-emitting device 100, unlike that according to the comparative example, conceivably enables the third electrode 8 to release excess carriers. To be specific, driving the light-emitting device 100 while switching between the first state and the second state conceivably enables accumulated excess carrier to be released.

This enables the light-emitting layer 4 to emit light while maintaining carrier injection balance within the light-emitting layer 4, thus avoiding reduction in the performance of the light-emitting device 100. That is, the light-emitting device 100 can achieve a light-emitting device that has higher performance than before. In addition, driving the light-emitting device 100 while switching the first state and the second state can also avoid deterioration of the light-emitting layer 4 and individual function layers. This can enhance the reliability of the light-emitting device 100. As described above, the light-emitting device 100 that is highly reliable can be provided.

Frequency in Switching Between First State and Second State

Figure 7:
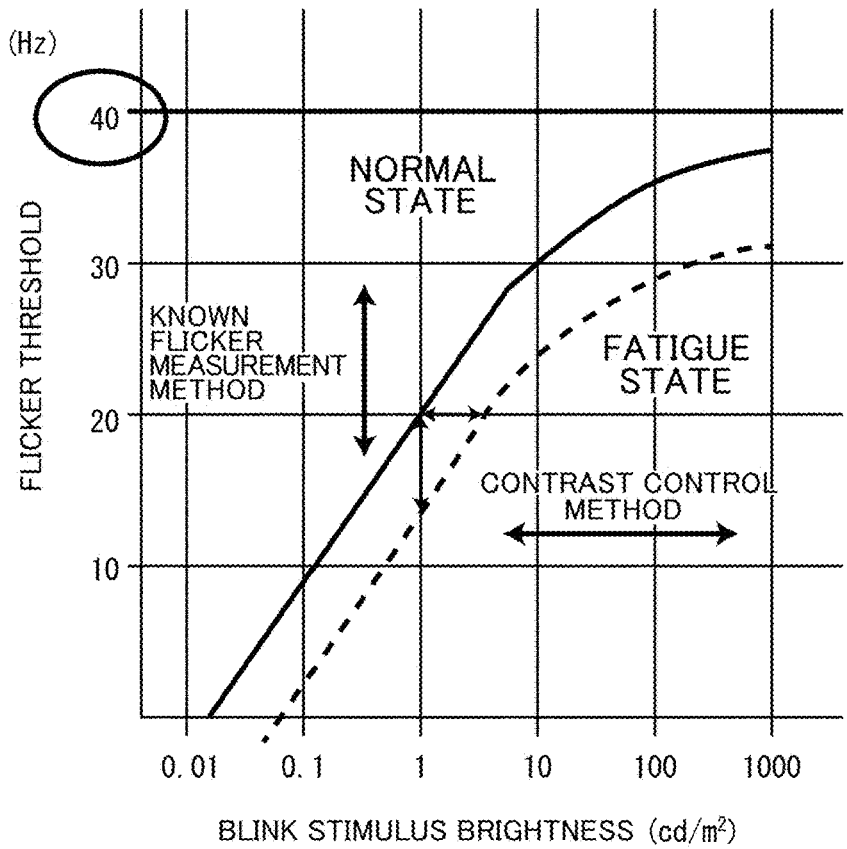
FIG. 7 is a graph showing an example result of a publicly known flicker test.

FIG. 7 is a graph (indication of source: Non-Patent Literature 1) showing an example result of a publicly known flicker test. The flicker threshold (vertical axis) in FIG. 7 refers to an upper-limit flicker frequency (blink frequency) at which a human can visually recognize a blink stimulus in the brightness (lateral axis) of the blink stimulus.

FIG. 7 shows that the flicker threshold is lower than 40 Hz in the range of typical blink stimulus brightness. Accordingly, it is preferable in the first embodiment that the switching between the first state and the second state be performed at a frequency of 40 Hz or greater. That is, it is preferable in the first embodiment that S1 and S2 be changed alternately at a frequency (switching frequency) of 40 Hz or greater.

A flicker resulting from the switching between the first state and the second state is expected not to be almost recognized visually by a user when the switching frequency is set to 40 Hz or greater. Excess carriers can be hence conceivably released together with reduction in a flicker's adverse effect (e.g., discomfort) that is exerted on the user. In addition, setting the switching frequency to 40 Hz or greater can sufficiently reduce the time for excess carrier accumulation, thereby avoiding deterioration of the light-emitting layer 4 and individual function layers with more certainty. This can further improve the reliability of the light-emitting device 100.

Positional Relationship Between Each Light Emitting Portion and Third Electrode in Light Emitting Device 100

Figure 8:
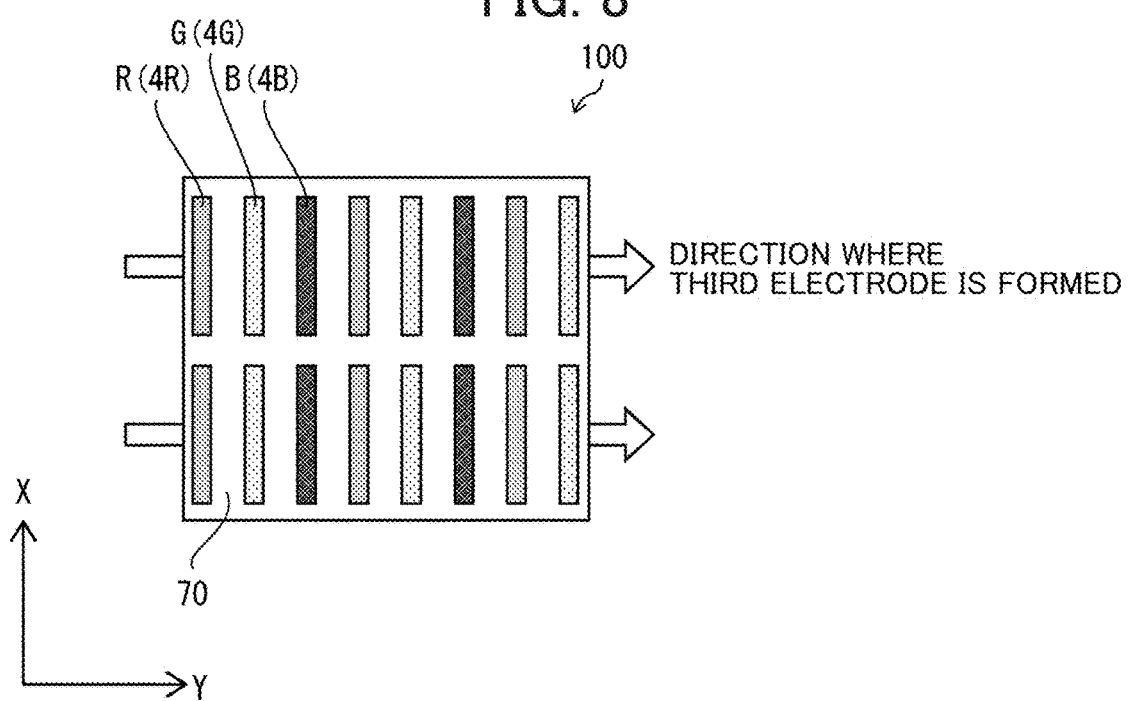
FIG. 8 illustrates the positional relationship between each light-emitting portion and the third electrode in the light-emitting device according to the first embodiment.

FIG. 8 illustrates the positional relationship between each light-emitting portion and the third electrode in the light-emitting device 100. The light-emitting device 100 is configured such that the red light-emitting portion 4R, the green light-emitting portion 4G, and the blue light-emitting portion 4B are repeatedly arranged in the Y-direction (first direction) in the order recited, as illustrated also in FIG. 4. The light-emitting device 100 is also configured such that a plurality of red light-emitting portions 4R, a plurality of green light-emitting portions 4G, and a plurality of blue light-emitting portions 4B are arranged in the X-direction (second direction), as illustrated in FIG. 8.

FIG. 8 illustrates an instance where the X-direction is the longer-side direction of each light-emitting portion, and where the Y-direction is a shorter-side direction of each light-emitting portion. The red light-emitting portions 4R, the green light-emitting portions 4G, and the blue light-emitting portions 4B have an equal size in the example of FIG. 8. The red light-emitting portions 4R, the green light-emitting portions 4G, and the blue light-emitting portions 4B thus have the same aspect ratio (the ratio of the length of their longer sides to the length of their shorter sides). Accordingly, the red light-emitting portions 4R, green light-emitting portions 4G, and blue light-emitting portions 4B in the example of FIG. 8 all fall under a particular light-emitting portion (described later on).

The third electrode 8 in the light-emitting device 100 is formed in the Y-direction so as to cross the red light-emitting portion 4R, the green light-emitting portion 4G and the blue light-emitting portion 4B, as illustrated in FIG. 8 (see also FIG. 3). Furthermore, the third electrode 8 is formed so as to cover at least a part of the bank 70 (i) between the red light-emitting portion 4R and the green light-emitting portion 4G, (ii) between the green light-emitting portion 4G and the blue light-emitting portion 4B, and (iii) between the blue light-emitting portion 4B and the red light-emitting portion 4R. Forming the third electrode 8 in such a manner as illustrated in FIG. 8 can conceivably release excess carriers simultaneously from the red light-emitting portion 4R, the green light-emitting portion 4G and the blue light-emitting portion 4B.

Modification

Figure 9:
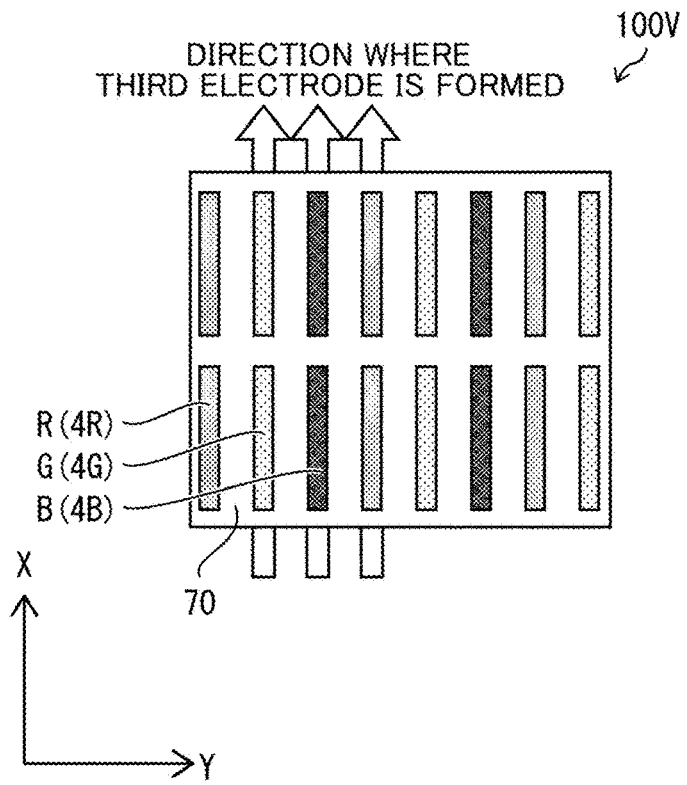
FIG. 9 illustrates the positional relationship between each light-emitting portion and the third electrode in a light-emitting device according to a modification.

FIG. 9 illustrates the positional relationship between each light-emitting portion and the third electrode in a light-emitting device 100V, which is a modification of the light-emitting device 100. FIG. 9 pairs up with FIG. 8. The sizes of the red light-emitting portion 4R, green light-emitting portion 4G and blue light-emitting portion 4B in the light-emitting device 100V and their arrangement are similar to those in the light-emitting device 100.

However, unlike the light-emitting device 100, the light-emitting device 100V includes the third electrode 8 formed in the X-direction (second direction). To be more specific, the third electrode 8 in the light-emitting device 100V is formed so as to cross (i) a plurality of red light-emitting portions 4R, (ii) a plurality of green light-emitting portions 4G, and (iii) a plurality of blue light-emitting portions 4B. The third electrode 8 in the light-emitting device 100V is also formed so as to cover at least a part of the bank 70 (i) between the plurality of red light-emitting portions 4R, (ii) between the plurality of green light-emitting portions 4G, and (iii) between the plurality of blue light-emitting portions 4B.

Forming the third electrode 8 in such a manner as illustrated in FIG. 9 can conceivably release excess carriers individually from the red light-emitting portion 4R, the green light-emitting portion 4G and the blue light-emitting portion 4B. A tendency of excess carriers within a light-emitting portion to accumulate typically depends on the material of the light-emitting portion (in more detail, the material's energy level). Accordingly, how much easy excess carriers accumulate seems to be different between the red light-emitting portion 4R, the green light-emitting portion 4G, and the blue light-emitting portion 4B. The configuration in FIG. 9 can conceivably release excess carriers individually from each light-emitting portion, with the difference in material between the individual light-emitting portions being reflected.

Modification

Figure 10:
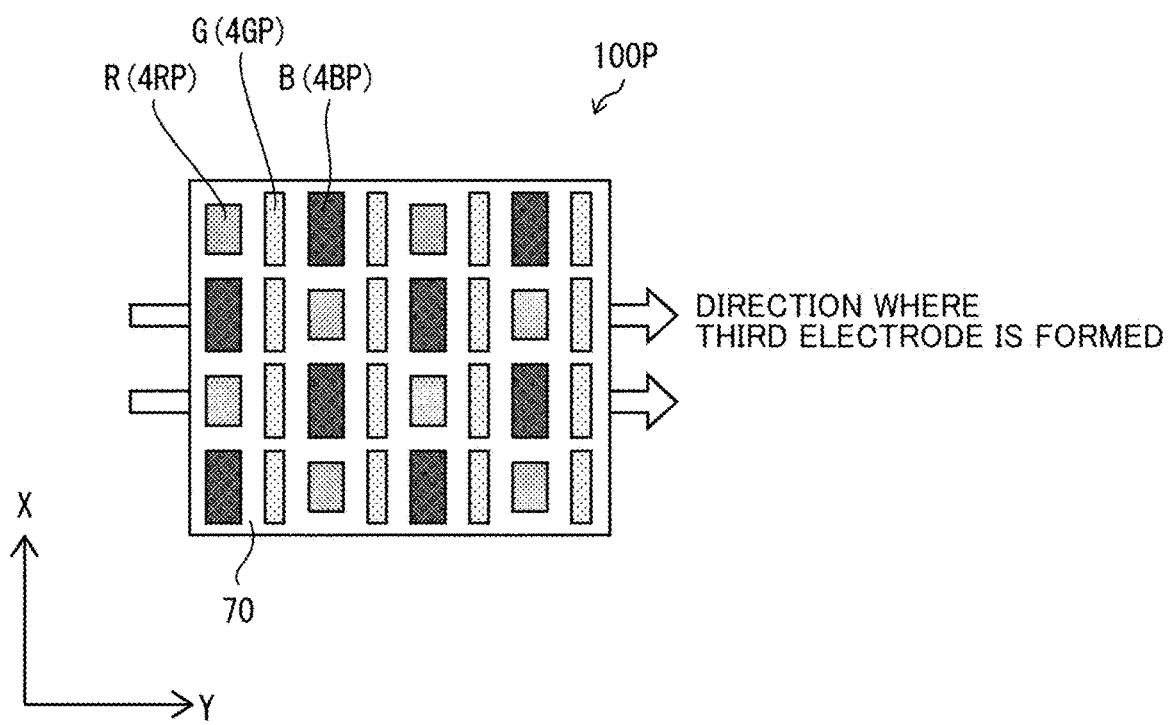
FIG. 10 illustrates the positional relationship between each light-emitting portion and the third electrode in a light-emitting device according to another modification.

FIG. 10 illustrates the positional relationship between each light-emitting portion and the third electrode in a light-emitting device 100P, which is another modification of the light-emitting device 100. The red light-emitting portion, green light-emitting portion and blue light-emitting portion of the light-emitting device 100P are respectively defined as a red light-emitting portion 4RP (first light-emitting portion), a green light-emitting portion 4GP (second light-emitting portion), and a blue light-emitting portion 4BP (third light-emitting portion).

Unlike those in the light-emitting device 100, the red light-emitting portion 4RP, green light-emitting portion 4GP and blue light-emitting portion 4BP in the light-emitting device 100P have their respective shapes different from each other. To be more specific, the red light-emitting portion 4RP, the green light-emitting portion 4GP, and the blue light-emitting portion 4BP have their respective aspect ratios different from each other.

One of the first to third light-emitting portions (red light-emitting portion 4RP, green light-emitting portion 4GP and blue light-emitting portion 4BP) that has a maximum aspect ratio is hereinafter defined as a particular light-emitting portion. Further, those excluding the particular light-emitting portion among the first to third light-emitting portions are defined as non-particular light-emitting portions. FIG. 10 illustrates an instance where the second light-emitting portion (green light-emitting portion 4GP) has a maximum aspect ratio among the first to third light-emitting portions. As described, the green light-emitting portion 4GP in FIG. 10 is an example particular light-emitting portion. Further, the red light-emitting portion 4RP (first light-emitting portion) and blue light-emitting portion 4BP (third light-emitting portion) in FIG. 10 are example non-particular light-emitting portions.

The X-direction (second direction) in the light-emitting device according to one aspect of the disclosure may be defined as the longer-side direction of the particular light-emitting portion. The Y-direction (first direction) in this case may be defined as a direction intersecting with the X-direction (second direction). The Y-direction in this case may be defined as, for instance, the shorter-side direction of the particular light-emitting portion.

At one location in the X-direction, the red light-emitting portion 4RP, green light-emitting portion 4GP and blue light-emitting portion 4BP in the light-emitting device 100P are repeatedly arranged in the Y-direction in the order recited. Further, at another location in the X-direction, the blue light-emitting portion 4BP, green light-emitting portion 4GP and red light-emitting portion 4RP are repeatedly arranged in the Y-direction in the order recited.

Figure 11:
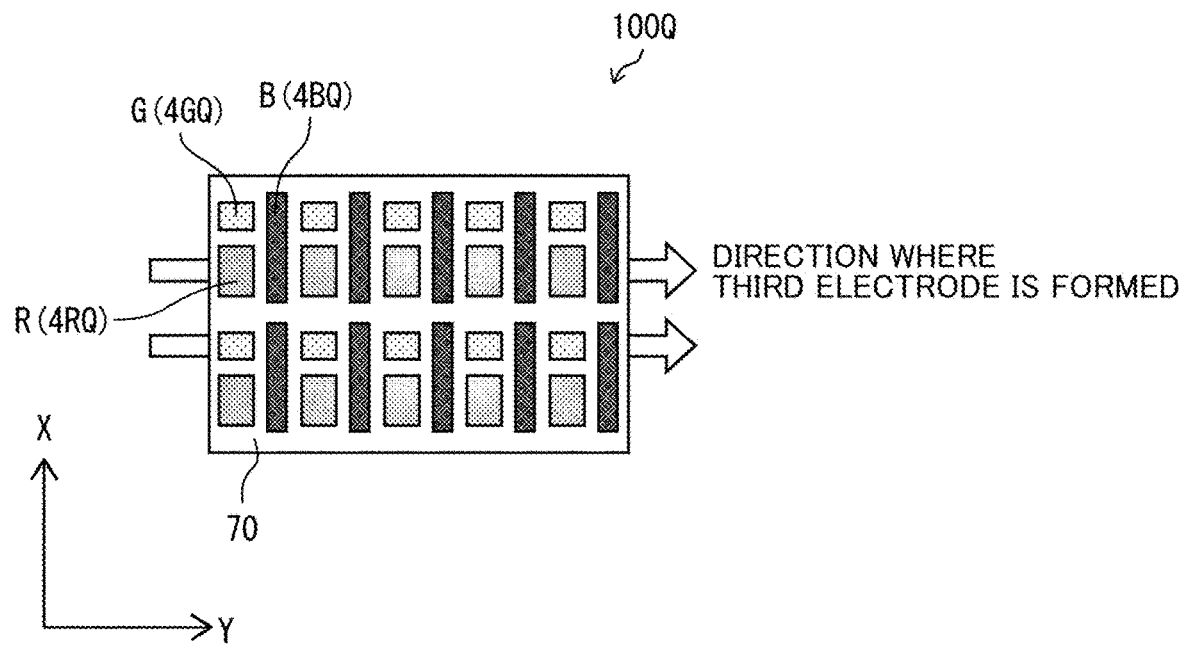
FIG. 11 illustrates the positional relationship between each light-emitting portion and the third electrode in a light-emitting device according to further another modification.

FIG. 11 illustrates the positional relationship between each light-emitting portion and the third electrode in a light-emitting device 100Q, which is further another modification of the light-emitting device 100. The red light-emitting portion, green light-emitting portion and blue light-emitting portion of the light-emitting device 100Q are respectively defined as a red light-emitting portion 4RQ (first light-emitting portion), a green light-emitting portion 4GQ (second light-emitting portion), and a blue light-emitting portion 4BQ (third light-emitting portion).

FIG. 11 illustrates an instance where the third light-emitting portion (blue light-emitting portion 4BQ) has a maximum aspect ratio among the first to third light-emitting portions. As described, the blue light-emitting portion 4BQ in FIG. 11 is another example particular light-emitting portion. Further, the red light-emitting portion 4RQ (first light-emitting portion) and green light-emitting portion 4GQ (second light-emitting portion) in FIG. 11 are different example non-particular light-emitting portions.

At one location in the X-direction, the red light-emitting portion 4RQ and blue light-emitting portion 4BQ in the light-emitting device 100Q are repeatedly arranged in the Y-direction in the order recited. Further, at another location in the X-direction, the green light-emitting portion 4GQ and the blue light-emitting portion 4BQ are repeatedly arranged in the Y-direction in the order recited.

The light-emitting device according to one aspect of the disclosure may be configured such that at least two of the first to third light-emitting portions (i.e., at least two colors of light-emitting portions) are repeatedly arranged in the Y-direction (first direction), as illustrated in FIG. 10 and FIG. 11.

The third electrode in the light-emitting device according to one aspect of the disclosure is preferably formed in the Y-direction so as to cross the at least two light-emitting portions (see for instance, FIG. 11). The third electrode is more desirably formed in the Y-direction so as to cross the first light-emitting portion, the second light-emitting portion and the third light-emitting portion (see for instance, FIG. 10).

Figure 12:
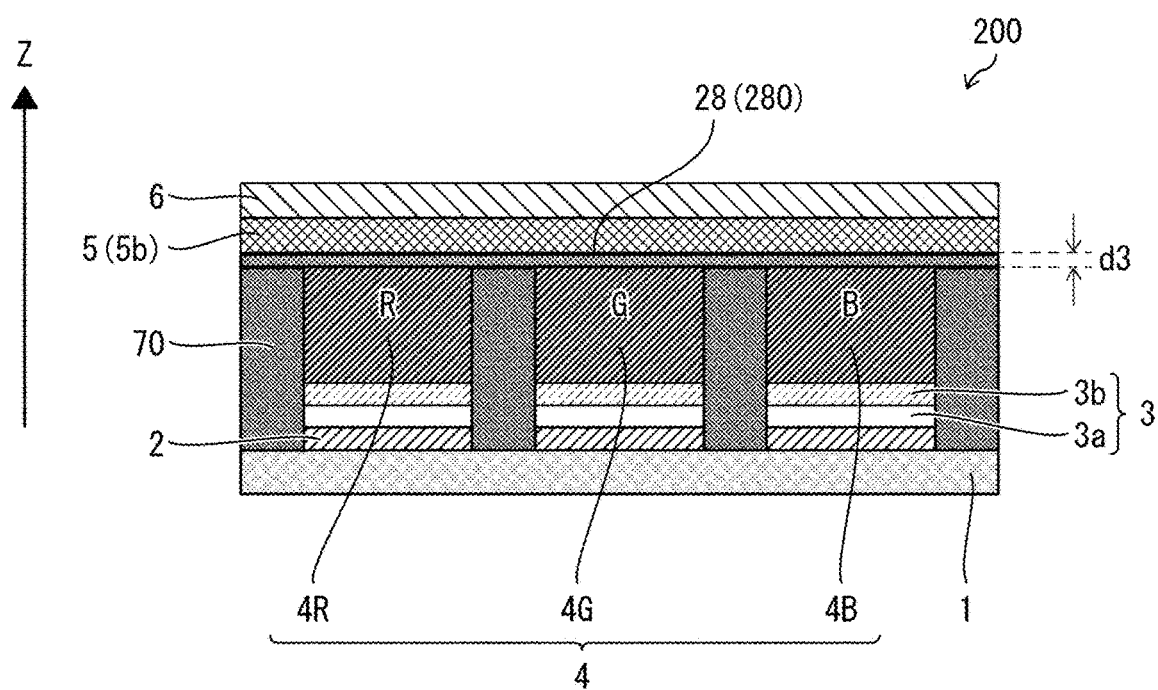
FIG. 12 illustrates the configuration of main components of a light-emitting device according to a second embodiment.

FIG. 12 illustrates the configuration of main components of a light-emitting device 200 according to a second embodiment. The light-emitting device 200 includes a third electrode 28 instead of the third electrode 8, which is included in the light-emitting device 100. The third electrode 28 has a plurality of linear portions 280 (first linear portions) extending in parallel with each other, as described later on.

As described above, the third electrode 8 is a plate-shaped electrode. The third electrode 28 in contrast is a linear electrode covering a part of the light-emitting layer 4. As described, the shape of the third electrode in the second embodiment is different from that in the first embodiment. The third electrode according to one aspect of the disclosure needs to be provided so as to at least partly overlap the light-emitting layer 4.

Process Steps for Manufacturing Light-Emitting Device 200

Figure 13:
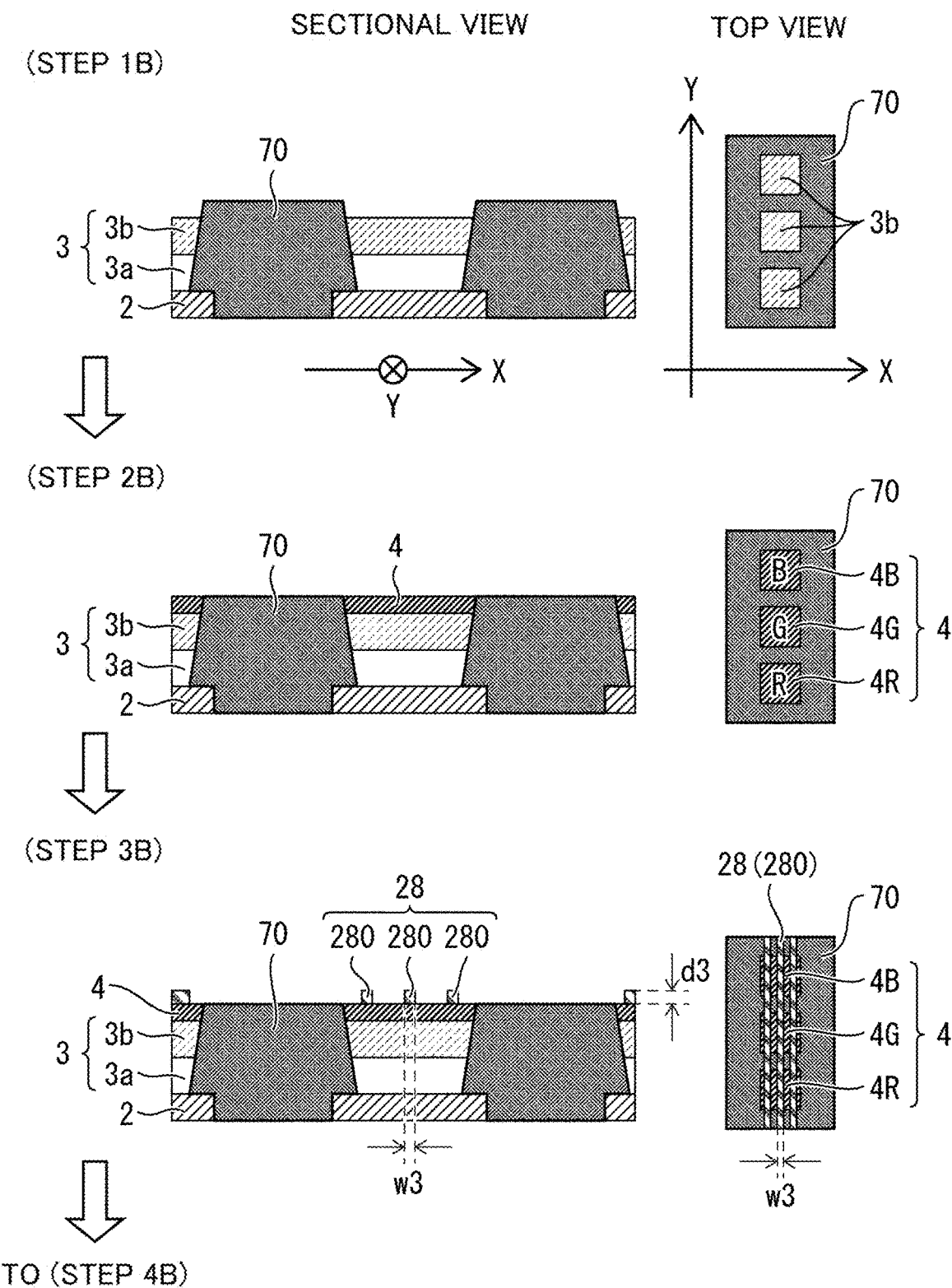
FIG. 13 illustrates process steps for manufacturing the light-emitting device according to the second embodiment.
Figure 14:
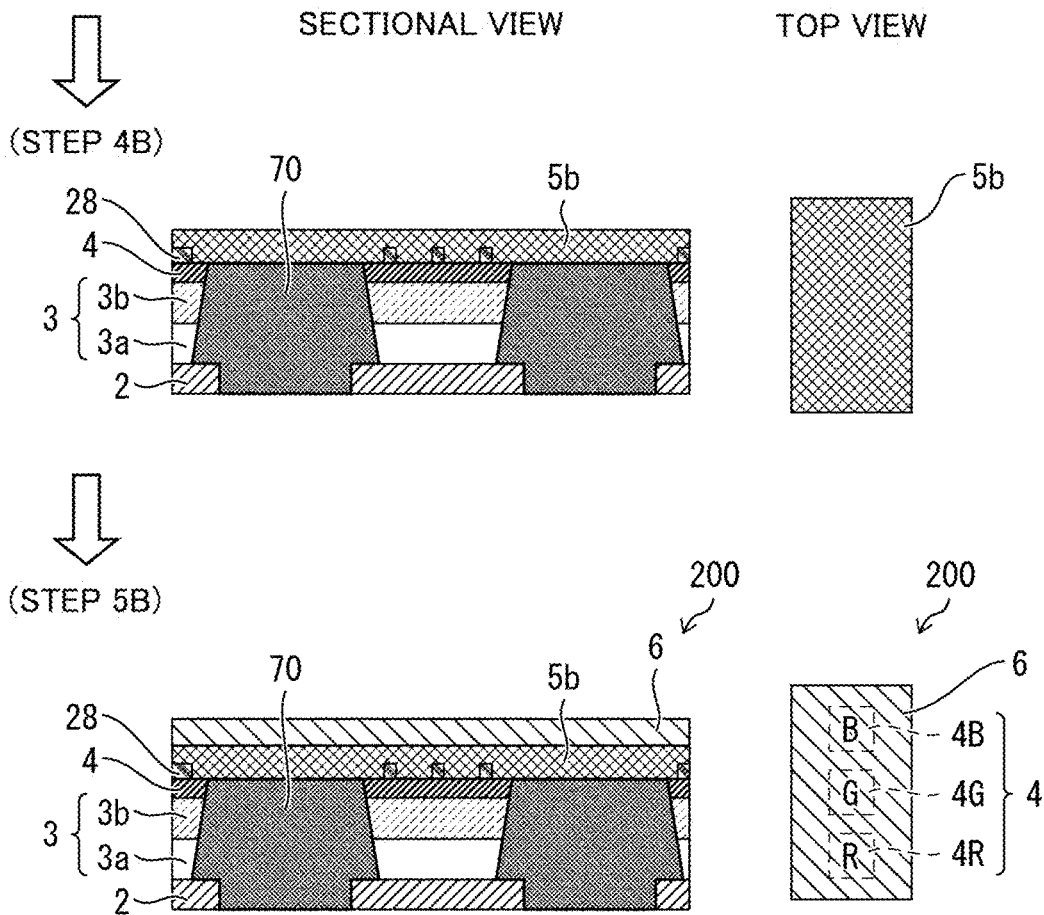
FIG. 14 illustrates process steps for manufacturing the light-emitting device according to the second embodiment.

FIG. 13 and FIG. 14 illustrate process steps (Steps 1B through 5B) for manufacturing the light-emitting device 200. FIG. 13 illustrates Steps 1B through 3B, and FIG. 14 illustrates Steps 4B through 5B.

Steps 1B Through 2B

These process steps, which are similar to Steps 1A through 2A, will not be described.

Step 3B

The third electrode 28 having the linear portions 280 is formed onto the light-emitting layer 4. The third electrode 28 may be formed through, for instance, sputtering using a metal mask. The linear portions 280 in the example of FIG. 13 are formed in the Y-direction. The reference sign d3 in Step 3B denotes the thickness of the third electrode 28 (in other words, the thickness of each linear portion 280). It is preferable that d3 be 5 to 20 nm, like that in the first embodiment. Moreover, w3 denotes the width (line width) of each linear portion 280.

Step 4B

The electron transport layer 5b is formed after the completion of Step 3B. The electron transport layer 5b covers the upper surfaces of the third electrode 28 and bank 70, as illustrated in FIG. 14.

Step 5B

The second electrode 6 is formed onto the electron transport layer 5b.

Excess Carrier Release in Light-Emitting Device 200

Figure 15:
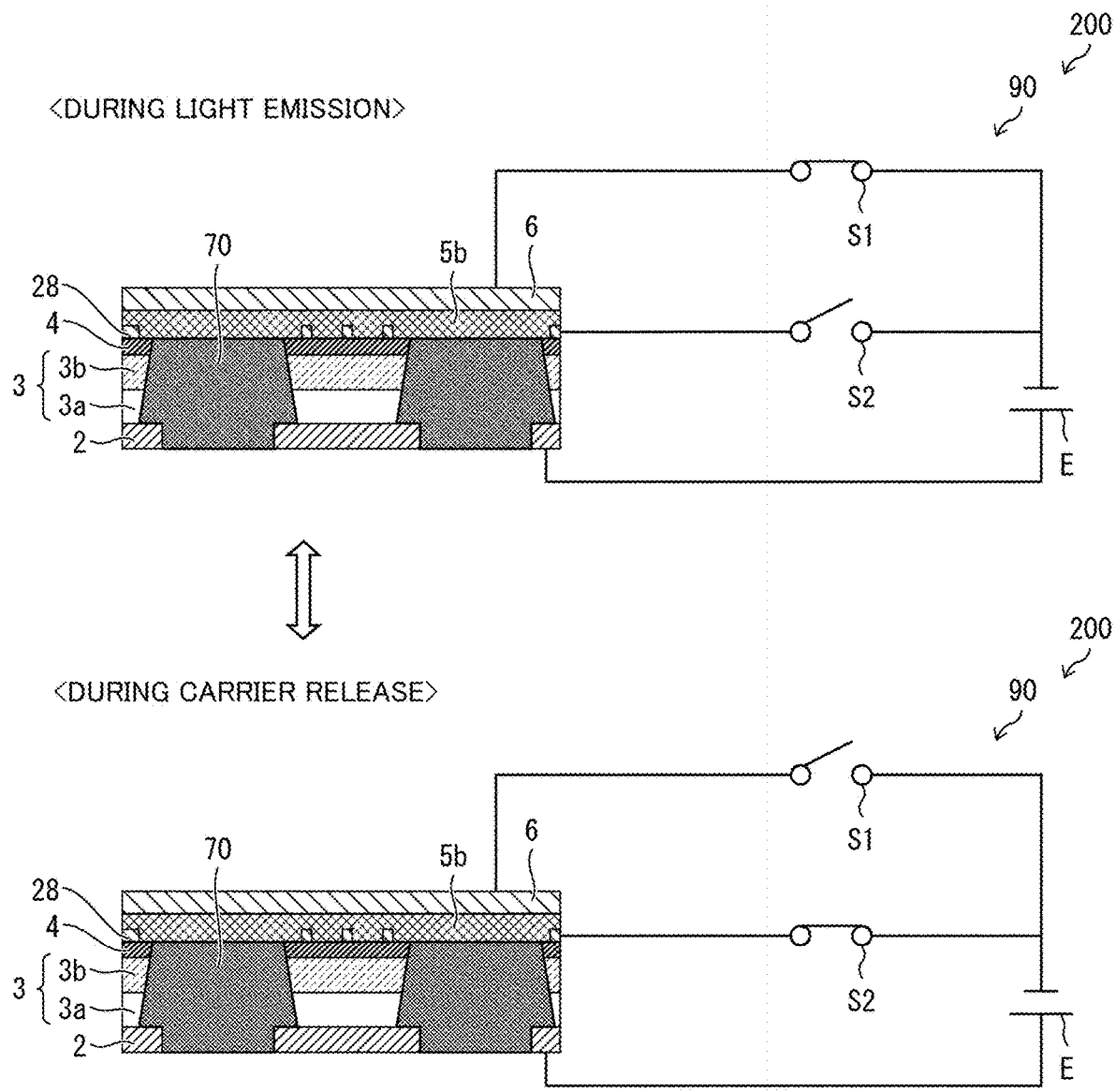
FIG. 15 illustrates the relationship between a drive circuit and first to third electrodes in the second embodiment.

FIG. 15 illustrates the relationship between the drive circuit 90 and the first to third electrodes in the second embodiment. The polarity in the connection relationship between the power source E and the first to third electrodes in the light-emitting device 200 is similar to that in the light-emitting device 100, as illustrated in FIG. 15. Thus, the third electrode 28 in the light-emitting device 200 is electrically connected to the negative electrode of the power source E via S2.

Like the light-emitting device 100, the light-emitting device 200 enables switching between the first state and the second state through the drive circuit 90. In the light-emitting device 200, excess carriers (holes) accumulated at the interface of the light-emitting layer 4 can be conceivably released via the third electrode 28 and S2 in the second state. The light-emitting device 200 thus has an effect similar to that of the light-emitting device 100. That is, the light-emitting device 200 that is highly reliable can be provided.

Effect of Light-Emitting Device 200

Furthermore, unlike that in the light-emitting device 100, the third electrode (e.g., third electrode 28) in the light-emitting device 200 is formed so as to cover a part of the light-emitting layer 4, as described above. In other words, unlike those in the light-emitting device 100, the individual sub-pixels in the light-emitting device 200 have their respective openings not covered with the third electrode. Hence, light emitted from the light-emitting layer 4 is less likely to be blocked by the third electrode in the light-emitting device 200 than that in the light-emitting device 100.

Further, the light can go out from the opening, and thus, the third-electrode material can be a metal material. For instance, the third electrode 28 is composed of a compound containing at least $TiO_2$ or AZO, is composed of at least one metal among gold, platinum, silver, cobalt, nickel, titanium, aluminum and chromium or is composed of an alloy of the at least one metal.

It is noted that the foregoing width w3 (the width of each linear portion 280) is preferably 0.5 to 20 μm. The lower-limit value of w3, i.e. 0.5 μm, is a numeric value that is set in view of the manufacturability of the linear portions 280. A width w3 of less than 0.5 μm can lower the manufacturability of the linear portions 280, because the linear portions 280 are minute.

Further, the upper-limit value of w3, i.e. 20 μm, is a numeric value that is set in view of the aperture ratio of each sub-pixel. Let each sub-pixel be 10000 μm$^2$ large (to be more specific, let the size of each sub-pixel measure 100 μm length×100 μm width) for instance. In this case, the aperture ratio stands at 0.8 when w3 is set to 20 μm. The aperture ratio is less than 0.8 when w3 is set to a value greater than 20 μm, thus possibly lowering the light taking efficiency of the light-emitting device 200.

It is noted that 1 to 40 linear portions 280 are preferably provided. The upper-limit value of this number, i.e. 40, is a numeric value that is set in view of the aperture ratio of each sub-pixel. For w3=0.5 μm, 40 or less linear portions 280 need to be provided so that a 10000 μm$^2$ sub-pixel has an aperture ratio of 0.8 or greater.

Modification

The width w3 may be set to be a larger value in the non-light-emission region (bank) than in the light-emission region (each light-emitting portion). This can promote the effect of excess carrier release in the third electrode 28 while maintaining the light taking efficiency of the light-emitting device 200.

Third Embodiment

Figure 16:
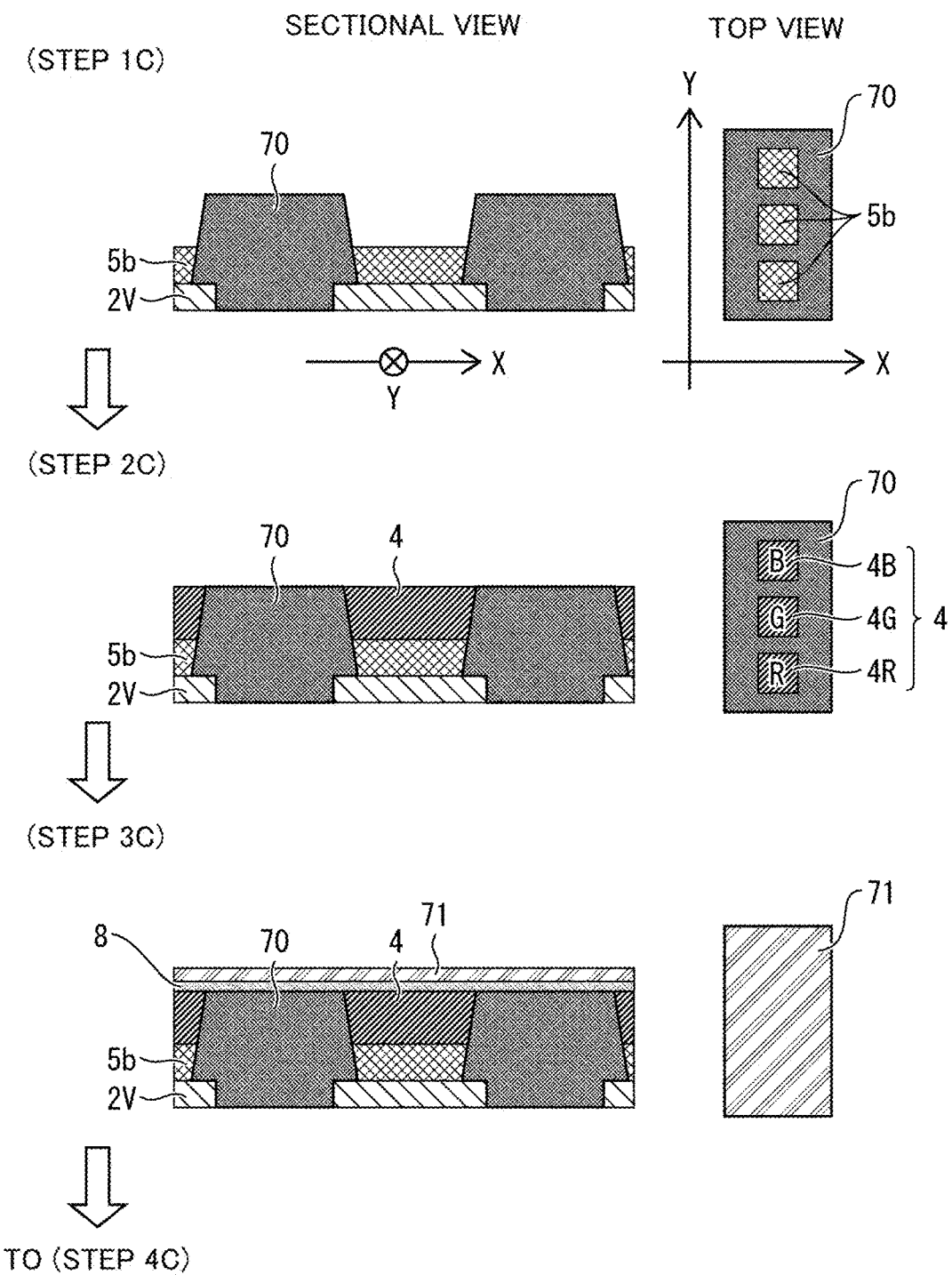
FIG. 16 illustrates process steps for manufacturing a light-emitting device according to a third embodiment.
Figure 17:
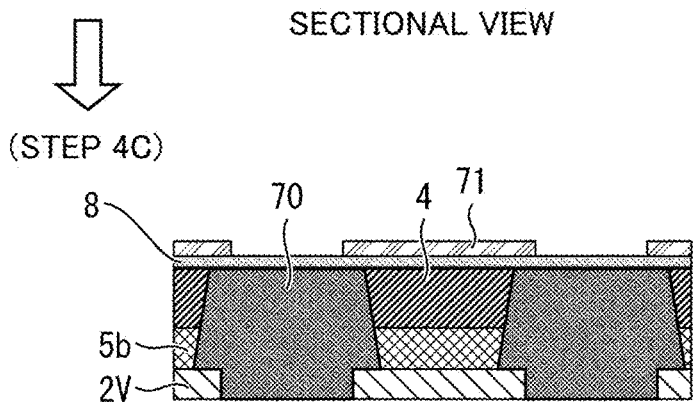
FIG. 17 illustrates process steps for manufacturing the light-emitting device according to the third embodiment.
Figure 17:
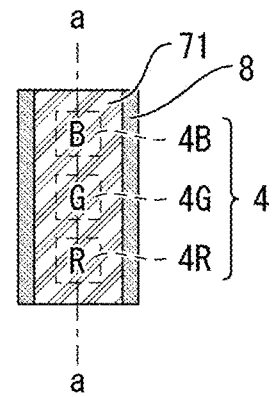
Figure 17:
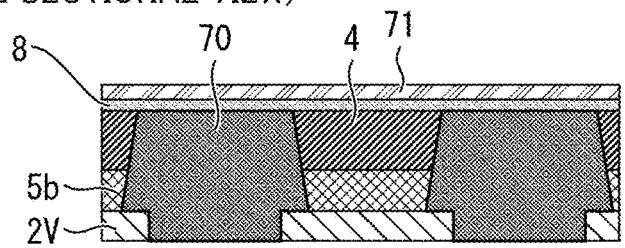
Figure 17:
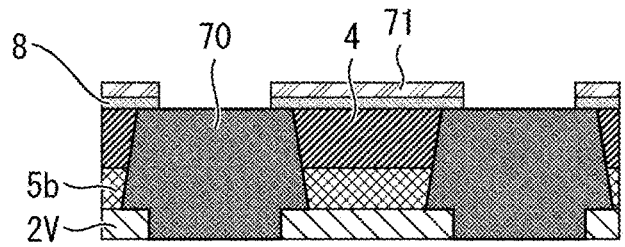
Figure 17:
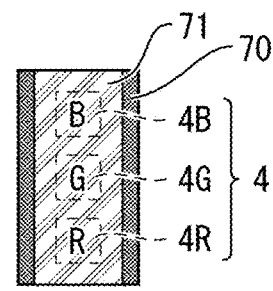
Figure 18:
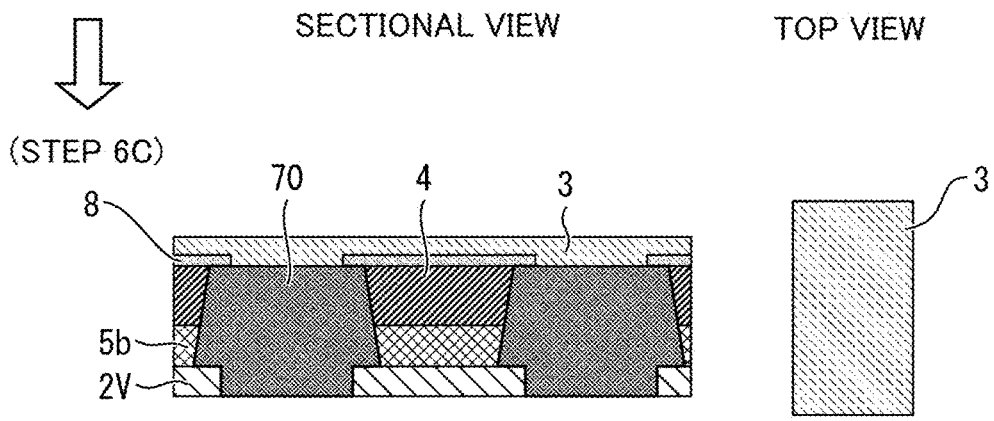
FIG. 18 illustrates process steps for manufacturing the light-emitting device according to the third embodiment.
Figure 18:
Figure 18:
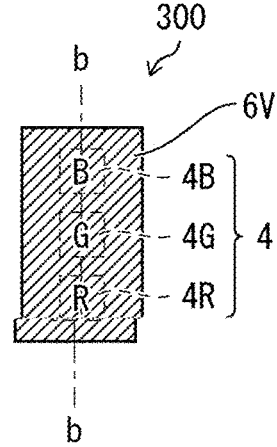
Figure 18:
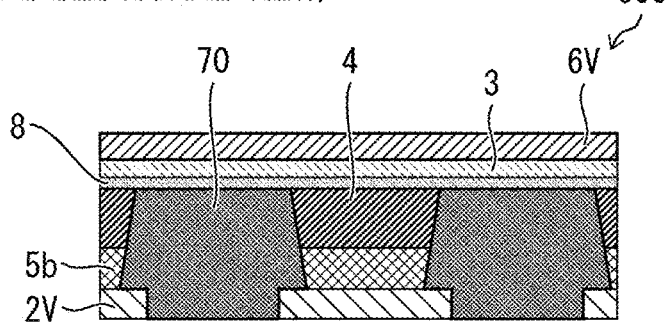

FIG. 16 to FIG. 18 illustrate process steps (Steps 1C through 7C) for manufacturing a light-emitting device 300 according to a third embodiment. FIG. 16 illustrates Steps 1C through 3C; FIG. 17, Steps 4C through 5C; and FIG. 18, Steps 6C through 7C. For simplification, the following describes an instance where the light-emitting device 300 has a third electrode (third electrode 8) similar to that of the light-emitting device 100. As such, Steps 1C to 7C respectively correspond to Steps 1A to 7A described above. Nevertheless, the light-emitting device 300 may, have as a matter of course, the third electrode 28 instead of the third electrode 8.

The light-emitting device 300 includes a first electrode 2V and a second electrode 6V, as illustrated in FIG. 18, instead of the first electrode 2 and second electrode 6 of the light-emitting device 100. The first electrode 2V is a cathode, and the second electrode 6V is an anode. That is, the position of the anode and cathode in the light-emitting device 300 is reversed when compared with that in the light-emitting device 100. As such, the position of each function layer relating to the anode and cathode is reversed as well in the light-emitting device 300 when compared with that in the light-emitting device 100.

Step 1C

The first process step is forming the first electrode 2V (cathode) onto a TFT substrate not shown. The bank 70 is then formed after the first electrode 2V is formed. The next is forming the electron transport layer 5b onto the first electrode 2V after forming the bank 70.

Step 2C

The light-emitting layer 4 is formed onto the electron transport layer 5b through a publicly known film formation method.

Step 3C Through 5C

These process steps, which are similar to Steps 3A through 5A, will not be described.

Step 6C

The remaining resist 71 is removed after Step 5C is completed. The hole injection/transport layer 3 is then formed after the resist 71 is removed. The hole injection/transport layer 3 covers the upper surfaces of the third electrode 8 and bank 70, as illustrated in FIG. 18.

Step 7C

The second electrode 6V (anode) is formed onto the hole injection/transport layer 3. It is noted that the hole injection/transport layer 3 on the bank 70 may be selectively removed as necessary through, for instance, ashing before the second electrode 6V is formed. For reference, FIG. 18 illustrates Step 7C further in a sectional view taken along line b-b in its top view.

Excess Carrier Release in Light-Emitting Device 300

Figure 19:
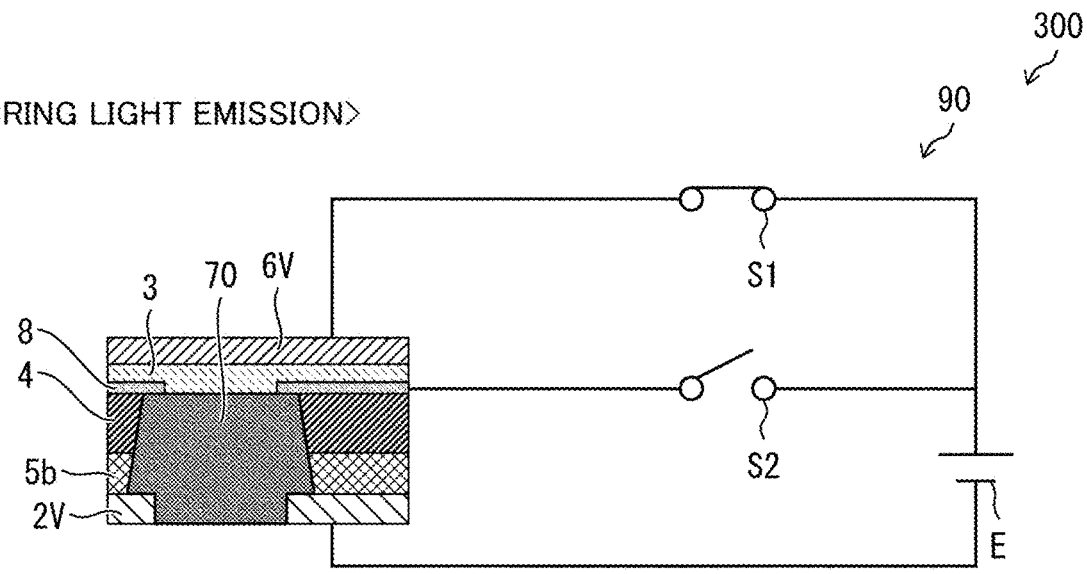
FIG. 19 illustrates the relationship between a drive circuit and first to third electrodes in the third embodiment.
Figure 19:
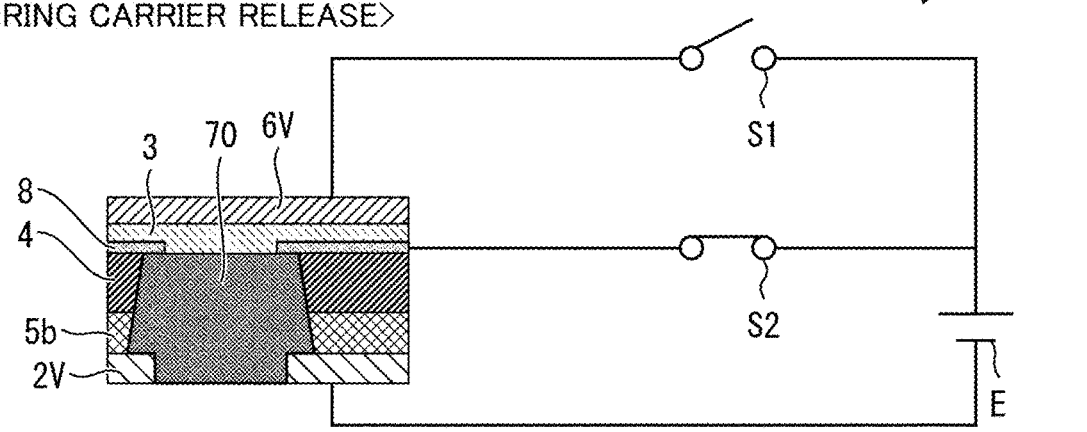

FIG. 19 illustrates the relationship between the drive circuit 90 and the first to third electrodes in the third embodiment. FIG. 19 pairs up with FIG. 5. The anode (first electrode 2V) in the light-emitting device 300 is electrically connected to the negative electrode of the power source E, as illustrated in FIG. 19. Moreover, the cathode (second electrode 6V) is electrically connected to the positive electrode of the power source E via S1. Further, the third electrode 8 is electrically connected to the positive electrode of the power source E via S2. As described, the polarity in the connection relationship between the power source E and the first to third electrodes is reversed in the light-emitting device 300 when compared with that in the light-emitting device 100.

Like the light-emitting device 100, the light-emitting device 300 enables switching between the first state and the second state through the drive circuit 90. The first electrode 2V and the second electrode 6V are electrically connected together in the first state, as illustrated in DURING LIGHT EMISSION in FIG. 19. Hence in the first state, excess carriers, which are herein electrons, can accumulate at the interface between the light-emitting layer 4 and the third electrode 8 (the interface of the light-emitting layer 4 adjacent to the hole injection/transport layer 3).

The first electrode 2V and the second electrode 6V are not electrically connected together in the second state by contrast, as illustrated in DURING CARRIER RELEASE in FIG. 19. The first electrode 2V and the third electrode 8 are instead electrically connected together in the second state. Hence in the second state, the excess carriers (electrons) accumulated at the foregoing interface of the light-emitting layer 4 can be conceivably released via the third electrode 8 and S2.

As described above, the light-emitting device 300 has an effect similar to that of the light-emitting device 100. That is, the light-emitting device 300 that is highly reliable can provided.

Fourth Embodiment

Figure 20:
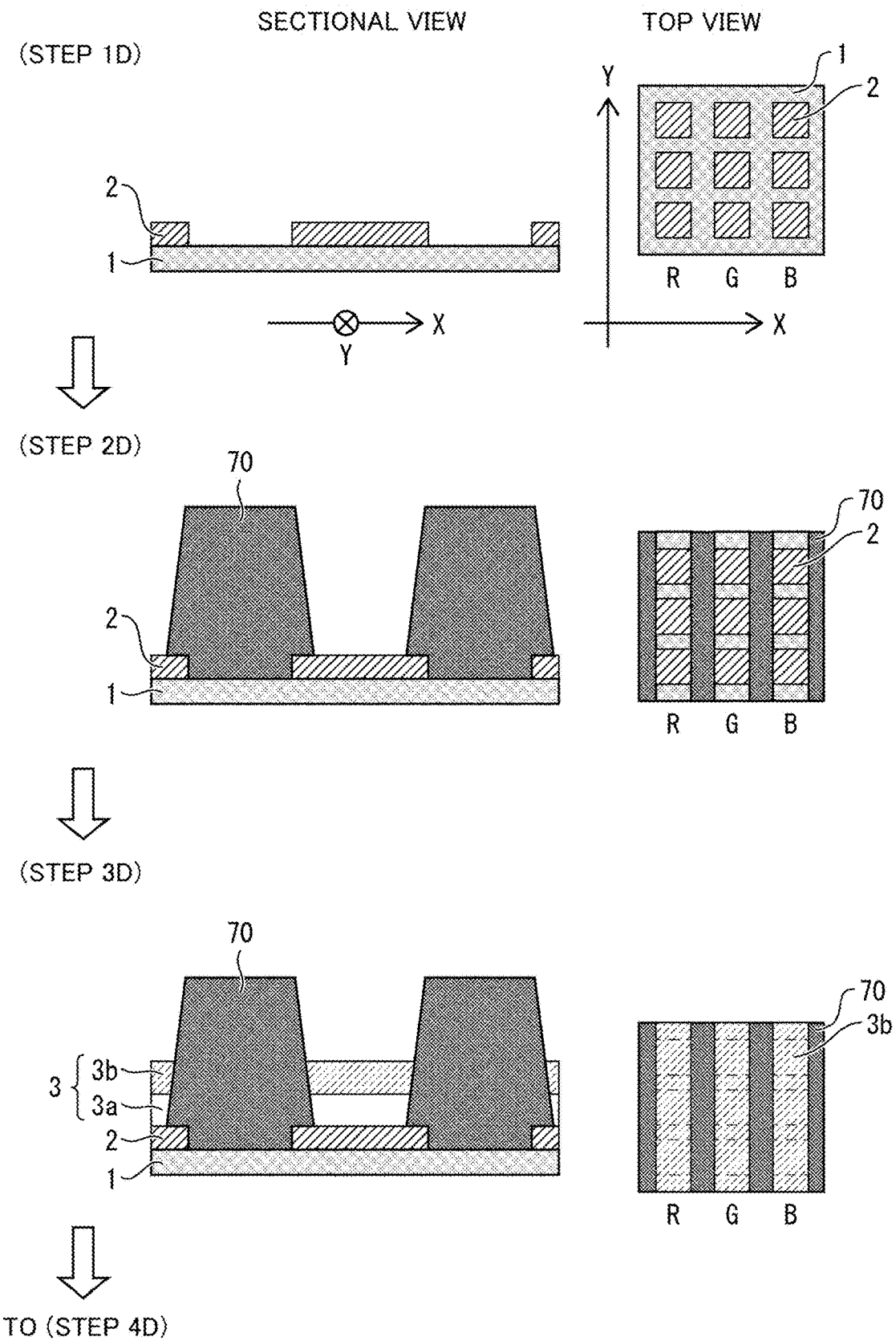
FIG. 20 illustrates process steps for manufacturing a light-emitting device according to a fourth embodiment.
Figure 21:
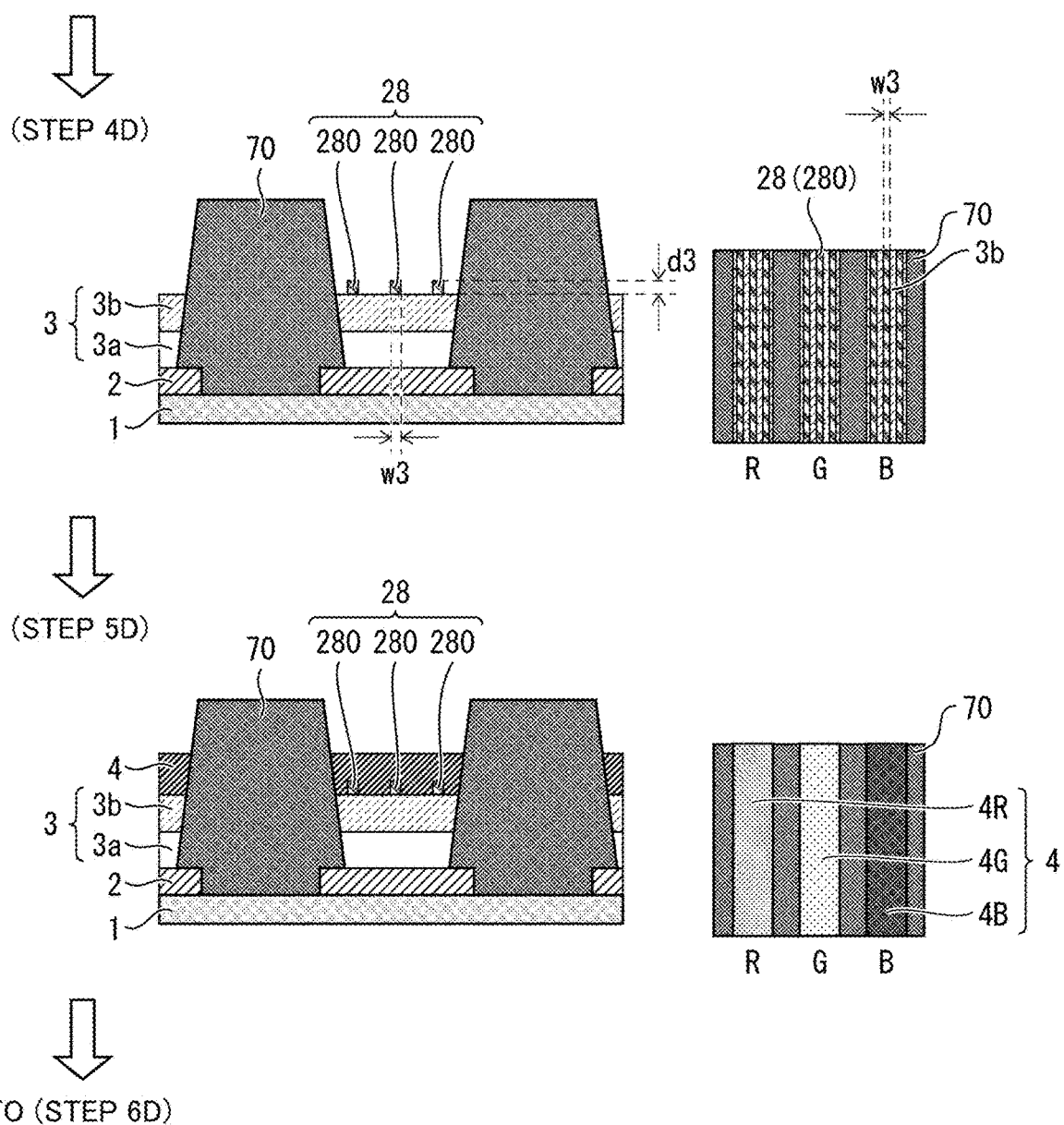
FIG. 21 illustrates process steps for manufacturing the light-emitting device according to the fourth embodiment.
Figure 22:
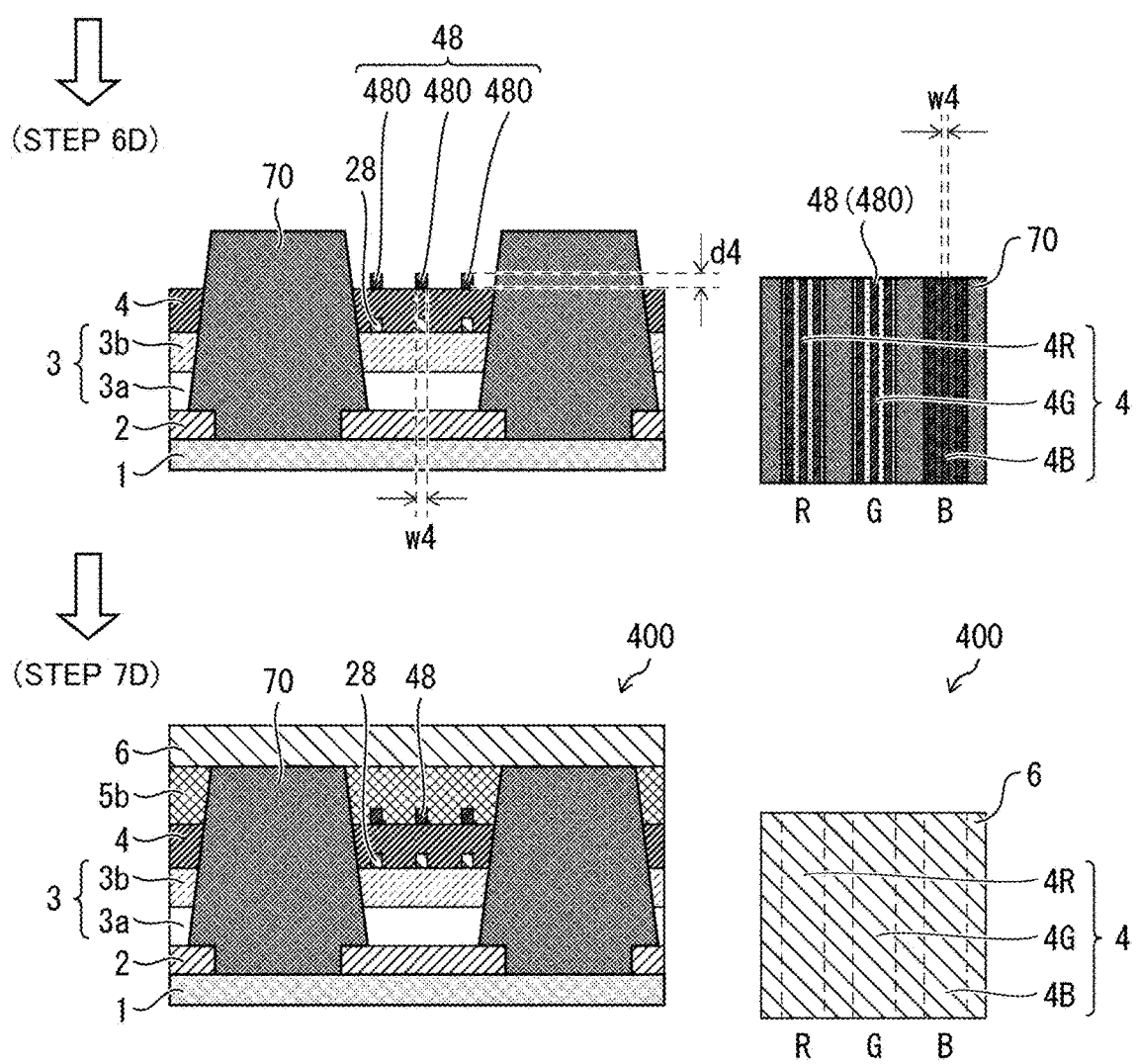
FIG. 22 illustrates process steps for manufacturing the light-emitting device according to the fourth embodiment.

FIG. 20 to FIG. 22 illustrate process steps (Steps 1D through 7D) for manufacturing a light-emitting device 400 according to a fourth embodiment. FIG. 20 illustrates Steps 1D through 3D; FIG. 21, Steps 4D through 5D; and FIG. 22, Steps 6D through 7D. It is noted that FIG. 20 to FIG. 22 illustrate the substrate 1, unlike FIG. 2 to FIG. 4.

Unlike the light-emitting devices 100 to 300, the light-emitting device 400 further includes a fourth electrode 48, as illustrated in FIG. 22. The fourth electrode according to one aspect of the disclosure is an electrode that pairs up with the foregoing third electrode. The fourth embodiment describes an instance where the light-emitting device 400 has the third electrode 28. Nevertheless, the light-emitting device 400 may have the third electrode 8 instead of the third electrode 28. The light-emitting device 400 in this case needs to have the fourth electrode having a shape similar to that of the third electrode 8. The fourth electrode according to one aspect of the disclosure needs to be provided so as to at least partly overlap the light-emitting layer 4. The fourth electrode 48 in the example of the fourth embodiment is in contact with the light-emitting layer 4.

Step 1D

The first electrode 2 (anode) is formed onto a TFT substrate not shown.

Step 2D

The bank 70 is formed after the first electrode 2 is formed. It is noted that unlike that according to the first embodiment, the light-emitting device 400 according to the fourth embodiment is manufactured in such a manner that the red light-emitting portion 4R, the green light-emitting portion 4G, and the blue light-emitting portion 4B are repeatedly arranged in the X-direction (the side-to-side direction of the drawing sheet in the top view) in the order recited. The X-direction in FIG. 20 to FIG. 22 is thus another example of the first direction. In addition, the light-emitting device 400 according to the fourth embodiment is manufactured in such a manner that a plurality of red light-emitting portions 4, a plurality of green light-emitting portions 4G, and a plurality of blue light-emitting portions 4B are arranged in the Y-direction (the up-and-down direction of the drawing sheet in the top view). The Y-direction in FIG. 20 to FIG. 22 is thus another example of the second direction. The bank 70 in the light-emitting device 400 is formed in the Y-direction so as to separate the red light-emitting portion 4R, green light-emitting portion 4G and blue light-emitting portion 4B repeatedly arranged in the X-direction.

Step 3D

The hole injection/transport layer 3 is formed onto the first electrode 2 after the bank 70 is formed. Like that in the first embodiment, the first process step is forming the hole injection layer 3a onto the first electrode 2. The next is forming the hole transport layer 3b onto the hole injection layer 3a.

Step 4D

The third electrode 28 is formed onto the hole transport layer 3b. The linear portions 280 are formed in the Y-direction (in other words, along the bank 70). It is noted that d3 in Step 4D in FIG. 21 denotes the thickness of the third electrode 28 (in other words, the thickness of each linear portion 280). It is also noted that w3 denotes the width of each linear portion 280.

Step 5D

The light-emitting layer 4 is formed onto the hole transport layer 3b.

Step 6D

The fourth electrode 48 is formed onto the light-emitting layer 4. The fourth electrode 48 may be formed through a method similar to that in the third electrode 28. The fourth electrode 48 according to the fourth embodiment has a shape similar to that of the third electrode 28. That is, the fourth electrode 48 has a plurality of linear portions 480 (second linear portions) extending in parallel with each other. The linear portions 480 in the example of FIG. 22 are formed in the Y-direction. The linear portions 480 are thus parallel with the linear portions 280. It is noted that d4 in Step 6D in FIG. 22 denotes the thickness of the fourth electrode 48 (in other words, the thickness of each linear portion 480). It is also noted that w4 denotes the width of each linear portion 480.

It is noted that a material that is suitable for the fourth electrode 48 is similar to that of the third electrode 28. Accordingly, the fourth electrode 48 is for instance composed of at least one metal among platinum, silver, cobalt, nickel, titanium, aluminum and chromium or composed of an alloy of the at least one metal.

It is also noted that various sizes that are suitable for the fourth electrode 48 are similar to those of the third electrode 28. It is thus preferable that d4 be 5 to 20 nm. It is also preferable that w4 be 0.5 to 20 μm.

Step 7D

The electron transport layer 5b is formed onto the light-emitting layer 4 after the fourth electrode 48 is formed. The second electrode 6 (cathode) is thereafter formed onto the electron transport layer 5b.

Drive Circuit 90V

Figure 23:
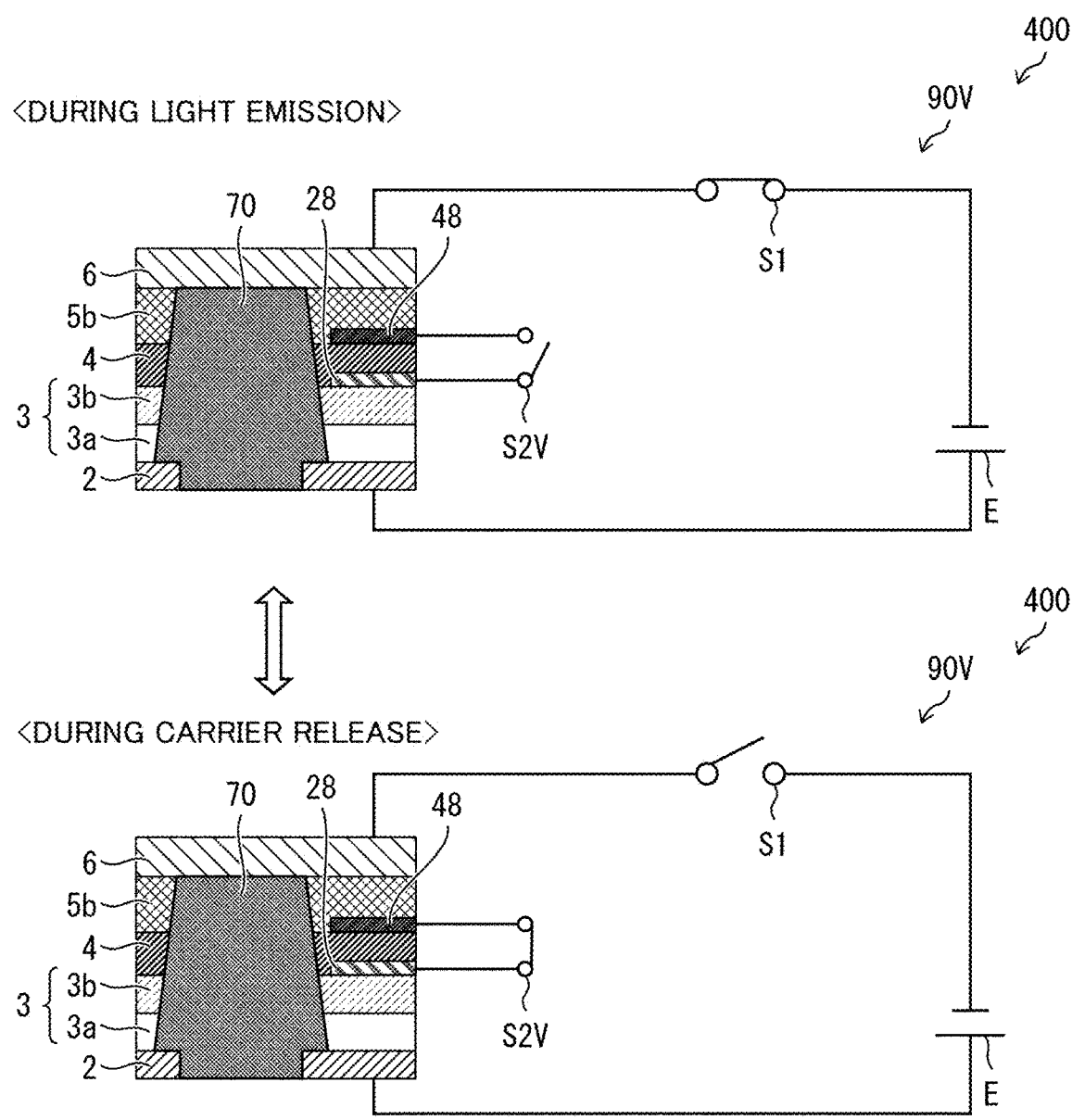
FIG. 23 illustrates the relationship between a drive circuit and first to fourth electrodes in the fourth embodiment.

The light-emitting device 400 preferably further includes a drive circuit 90V instead of the drive circuit 90. FIG. 23 illustrates the relationship between the drive circuit 90V and the first to fourth electrodes. The drive circuit 90V includes a switch S2V, as illustrated in FIG. 23, instead of S2 of the drive circuit 90. S2V is the second switch in the fourth embodiment.

S2V is a switch for switching (opening or closing) the electrical connection between the third electrode 28 and the fourth electrode 48. The third electrode 28 and the fourth electrode 48 are electrically connected to each other via S2V in the example of FIG. 23. Unlike that in the light-emitting device 100, the third electrode 28 in the light-emitting device 400 is not electrically connected to the power source E.

Meanwhile, the light-emitting layer 4 emits light when S1 is ON, as illustrated in DURING LIGHT EMISSION in FIG. 23. S2V is OFF during light emission. The third electrode 28 and the fourth electrode 48 are thus not electrically connected together. The third electrode 28 and the fourth electrode 48 are by contrast electrically connected together when S2V is ON, as illustrated in DURING CARRIER RELEASE in FIG. 23. The third electrode 28 and the fourth electrode 48 have equal potentials in the example of FIG. 23. S1 is OFF during carrier release, like that in the first embodiment. As described, the light-emitting layer 4 is stopped from light emission during carrier release.

In the fourth embodiment, where S1 is ON and S2V is OFF is referred also to as a first state (or an emission state). In contrast, where S1 is OFF and S2V is ON is referred also to as a third state. The third state is a carrier release state in the fourth embodiment. Alternate change between the opening and closing of each of S1 and S2V enables switching between the first state and the third state.

It is noted that the process step of opening or closing the electrical connection between the third electrode 28 and the fourth electrode 48 in a method for driving the light-emitting device according to one aspect of the disclosure is referred also to as a third step. The switching between the first state and the third state can be regarded as the switching between the first step and the third step.

Switching Between First State and Third State in Light-Emitting Device 400

The light-emitting device 400 has the third electrode 28 between the light-emitting layer 4 (EML) and the hole transport layer 3b (HTL), as illustrated in FIG. 23. The light-emitting device 400 further has the fourth electrode 48 between the light-emitting layer 4 and the electron transport layer 5b (ETL). Moreover, the first electrode 2 and the second electrode 6 are electrically connected together in the first state, as illustrated in DURING LIGHT EMISSION in FIG. 23. Hence in the first state, excess carriers, which are herein electrons, can accumulate at the interface between the light-emitting layer 4 and the third electrode 28 (the interface of the light-emitting layer 4 adjacent to the hole transport layer 3b). Also in the first state, excess carriers, which are herein holes, can accumulate at the interface between the light-emitting layer 4 and the fourth electrode 48 (the interface of the light-emitting layer 4 adjacent to the electron transport layer 5b).

The first electrode 2 and the second electrode 6 are not electrically connected together in the third state by contrast, as illustrated in DURING CARRIER RELEASE in FIG. 23. The third electrode 28 and the fourth electrode 48 are instead electrically connected together in the third state. Consequently in the third state, (i) the electrons accumulated at the interface between the light-emitting layer 4 and the third electrode 28 can be taken out of the third electrode 28, and (ii) the holes accumulated at the interface between the light-emitting layer 4 and the fourth electrode 48 can be taken out of the fourth electrode 48.

Effect of Light-Emitting Device 400

In the light-emitting device 400, providing the fourth electrode 48 conceivably enables both electrons and holes to be released. That is, unlike the light-emitting devices 100 to 300, the light-emitting device 400 conceivably enables both positive excess carriers and negative excess carriers to be released. The light-emitting device 400 can thus maintain the carrier injection balance within the light-emitting layer 4 more effectively than the light-emitting devices 100 to 300. As a result, a light-emitting device that has higher performance can be achieved. In addition, the reliability of the light-emitting device can be further enhanced. As described, the light-emitting device 400 that is further highly reliable can be provided.

In addition, the light-emitting device 400 needs no power source for excess carrier release, unlike the light-emitting devices 100 to 300. The light-emitting device 400 thus conceivably enables excess carriers to be released with lower power than the light-emitting devices 100 to 300. That is, the light-emitting device 400 is more suitable for the power savings in the light-emitting device.

It is noted that the switching between the first state and the third state is preferably performed at a frequency of 40 Hz or greater in the light-emitting device 400 as well for a reason similar to that given in the first embodiment. That is, it is preferable in the fourth embodiment that S1 and S2V be changed alternately at a frequency of 40 Hz or greater.

Fifth Embodiment

Figure 24:
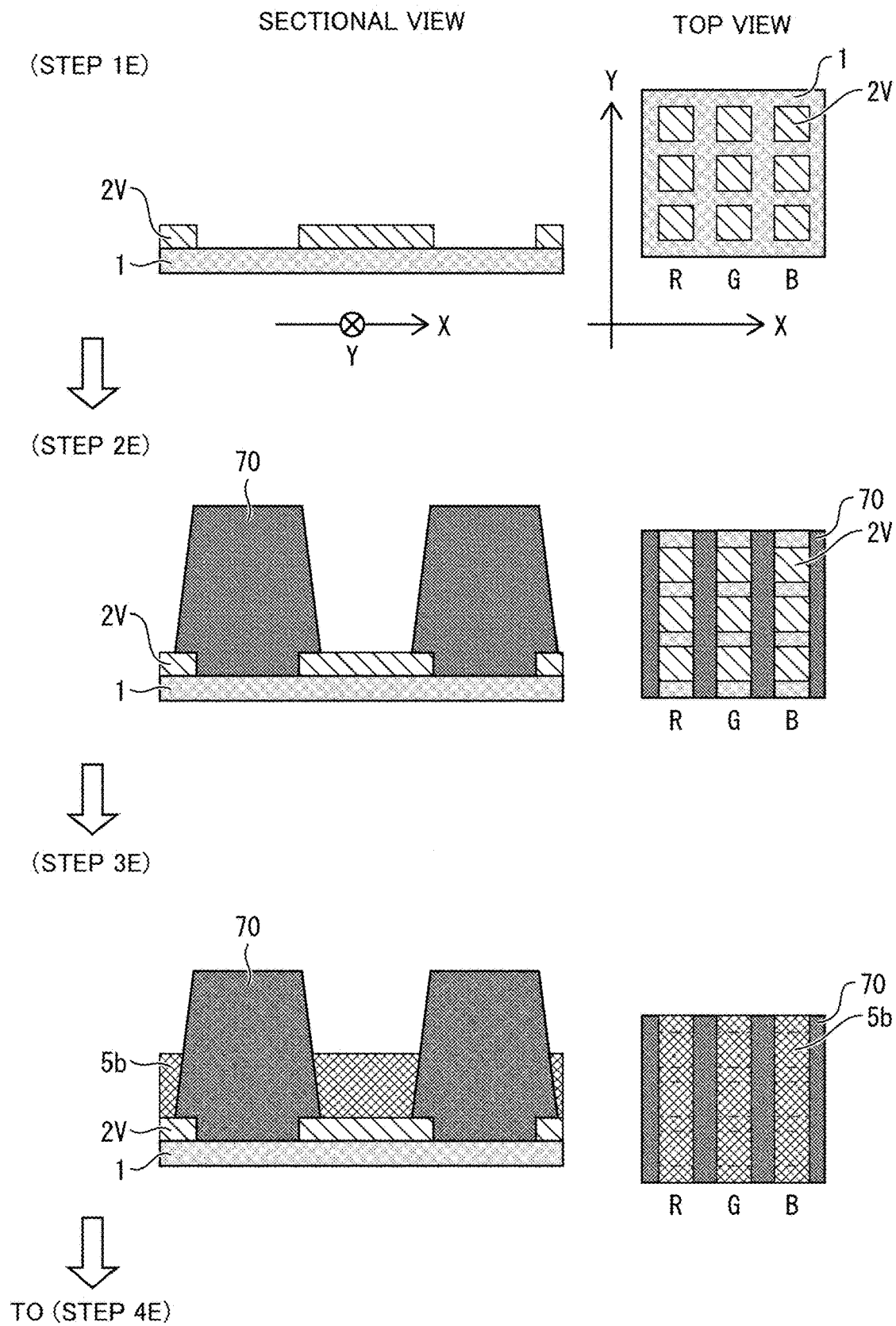
FIG. 24 illustrates process steps for manufacturing a light-emitting device according to a fifth embodiment.
Figure 25:
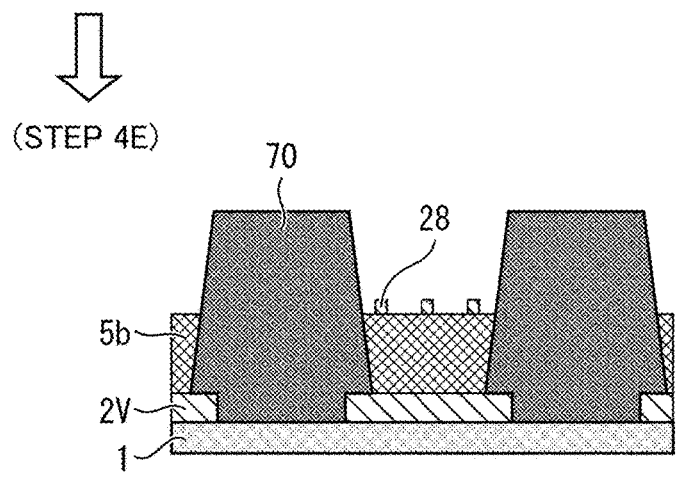
FIG. 25 illustrates process steps for manufacturing the light-emitting device according to the fifth embodiment.
Figure 25:
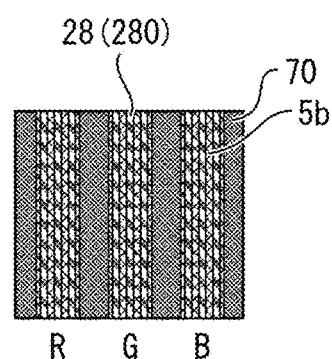
Figure 25:
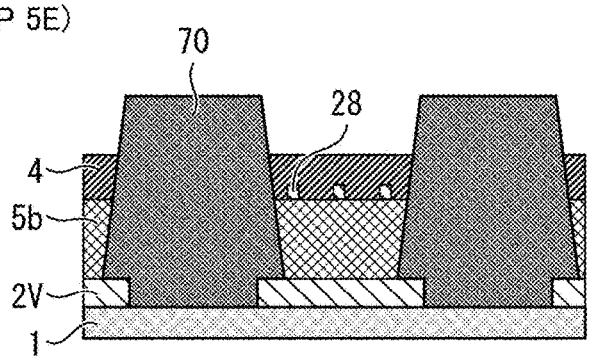
Figure 25:
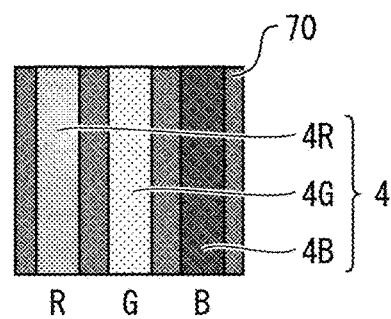
Figure 26:
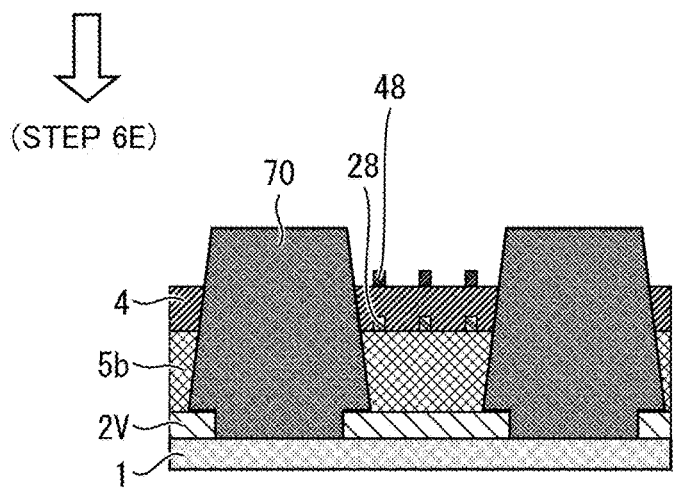
FIG. 26 illustrates process steps for manufacturing the light-emitting device according to the fifth embodiment.
Figure 26:
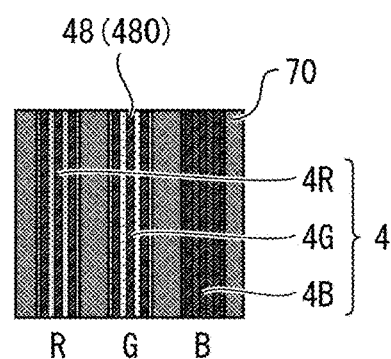
Figure 26:
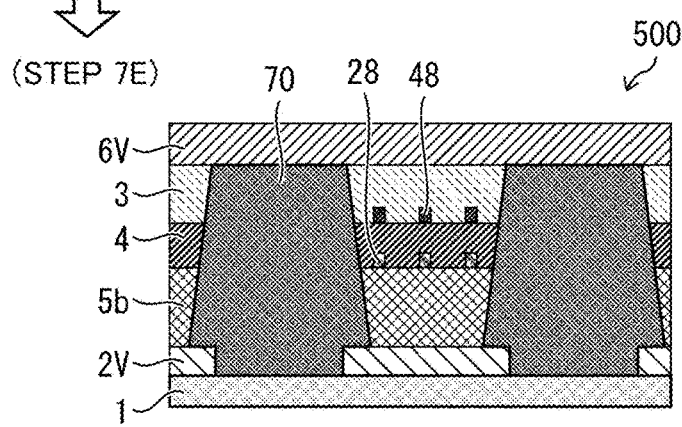
Figure 26:
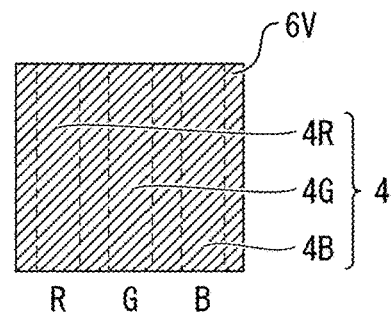

FIG. 24 to FIG. 26 illustrate process steps (Steps 1E through 7E) for manufacturing a light-emitting device 500 according to a fifth embodiment. FIG. 24 illustrates Steps 1E through 3E; FIG. 25, Steps 4E through 5E; and FIG. 26, Steps 6E through 7E.

The light-emitting device 500 includes the first electrode 2V (cathode) and the second electrode 6V (anode), as illustrated in FIG. 26, unlike the light-emitting device 400. That is, the position of the anode and cathode in the light-emitting device 500 is reversed when compared with that in the light-emitting device 400. As such, the position of each function layer relating to the anode and cathode is reversed as well in the light-emitting device 500 when compared with that in the light-emitting device 400.

Step 1E

The first electrode 2V (cathode) is formed onto a TFT substrate not shown.

Step 2E

This process step, which is similar to Step 2D, will not be described.

Step 3E

The electron transport layer 5b is formed onto the first electrode 2 after the bank 70 is formed.

Step 4E

The third electrode 28 is formed onto the electron transport layer 5b.

Step 5E

The light-emitting layer 4 is formed onto the electron transport layer 5b.

Step 6E

This process step, which is similar to Step 6D, will not be described.

Step 7E

The hole injection/transport layer 3 is formed onto the light-emitting layer 4 after the fourth electrode 48 is formed. The second electrode 6V (anode) is thereafter formed onto the hole injection/transport layer 3.

Effect of Light-Emitting Device 500

The light-emitting device 500 has an effect similar to that of the light-emitting device 400. The light-emitting device according to one aspect of the disclosure needs to be configured such that (i) the third electrode is disposed between the charge transport layer and the light-emitting layer on the first electrode, and such that (ii) the fourth electrode is disposed between the charge transport layer and the light-emitting layer on the second electrode. As described, the light-emitting device according to one aspect of the disclosure needs to be configured such that the third electrode and the fourth electrode are disposed so as to sandwich the light-emitting layer.

For instance, the foregoing light-emitting device 400 is configured such that (i) the third electrode 28 is disposed between the charge transport layer (hole injection/transport layer 3) and the light-emitting layer 4 on the first electrode 2, and such that (ii) the fourth electrode 48 is disposed between the charge transport layer (electron transport layer 5b) and the light-emitting layer 4 on the second electrode 6. In contrast, the light-emitting device 500 is configured such that (i) the third electrode 28 is disposed between the charge transport layer (electron transport layer 5b) and the light-emitting layer 4 on the first electrode 2V, and such that (ii) the fourth electrode 48 is disposed between the charge transport layer (hole injection/transport layer 3) and the light-emitting layer 4 on the second electrode 6V. In both configurations of the light-emitting devices 400 and 500, the third electrode 28 and fourth electrode 48 are disposed so as to sandwich the light-emitting layer 4.

Sixth Embodiment

Figure 27:
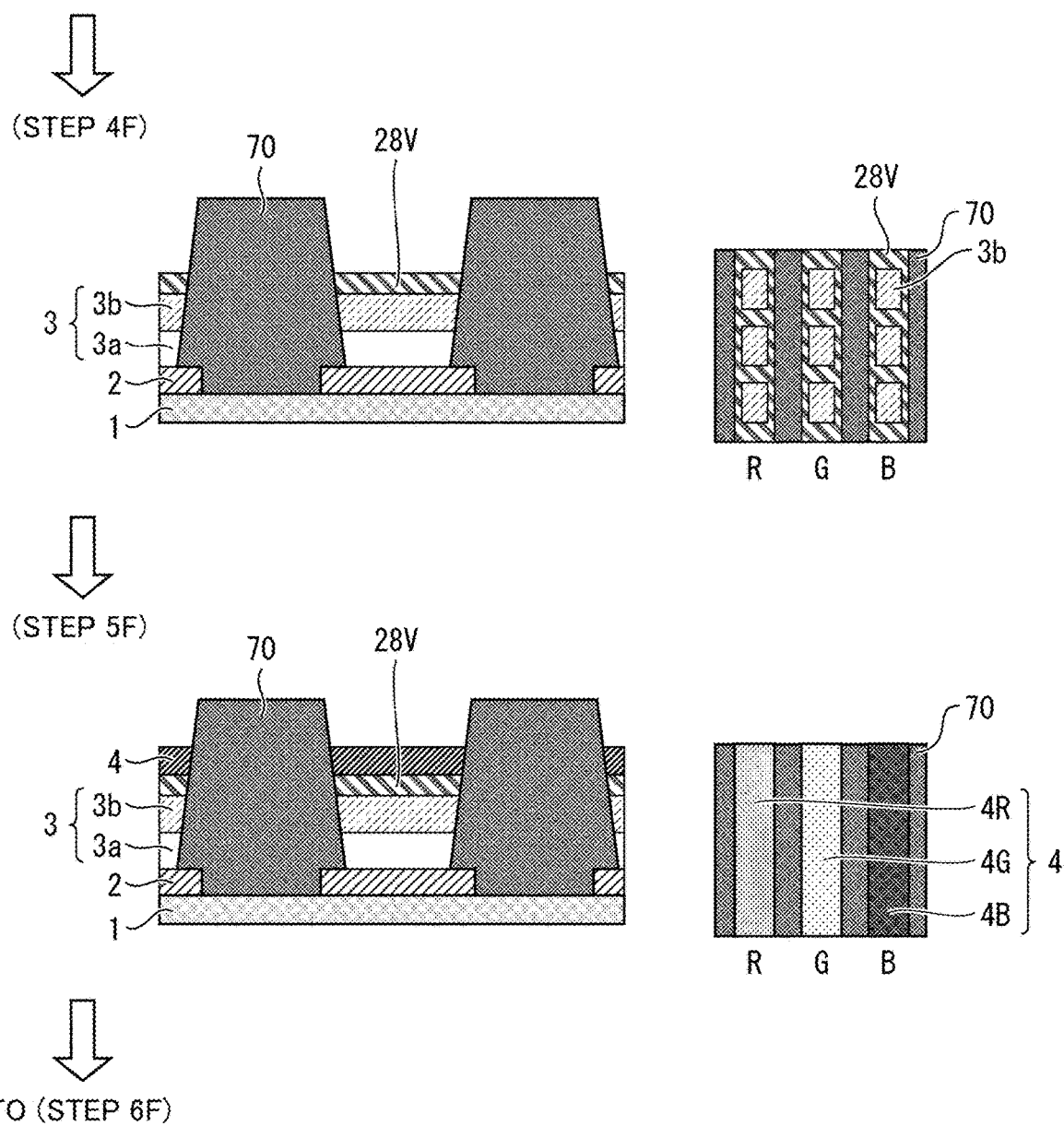
FIG. 27 illustrates process steps for manufacturing a light-emitting device according to a sixth embodiment.
Figure 28:
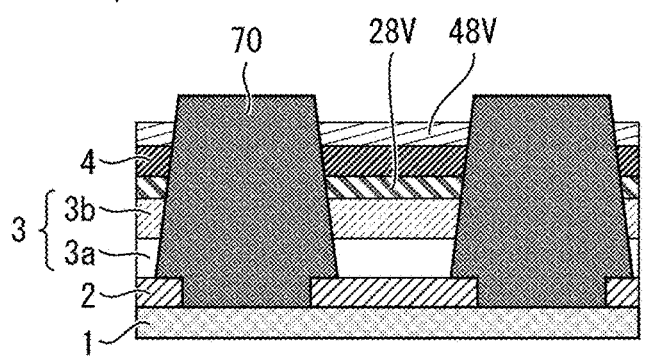
FIG. 28 illustrates process steps for manufacturing the light-emitting device according to the sixth embodiment.
Figure 28:
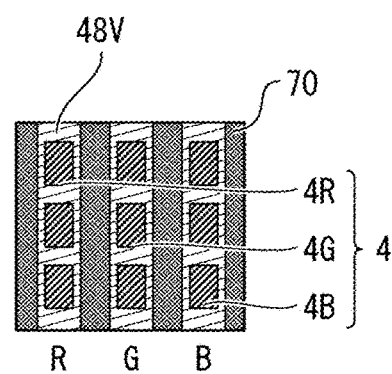
Figure 28:
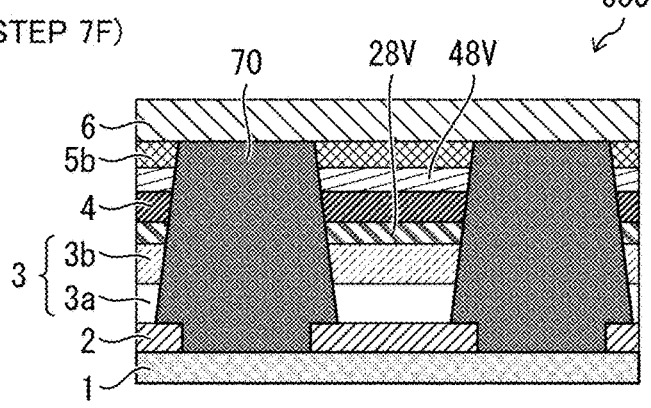
Figure 28:
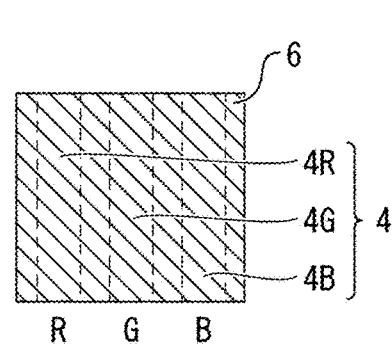

FIG. 27 and FIG. 28 illustrate process steps (Steps 1F through 7F) for manufacturing a light-emitting device 600 according to a sixth embodiment. The light-emitting device 600 is one modification of the light-emitting device 400. The light-emitting device 600 includes a third electrode 28V and a fourth electrode 48V instead of the third electrode 28 and the fourth electrode 48. The light-emitting device 600 has an effect similar to that of the light-emitting device 400.

Steps 1F through 3F, which are similar to Steps 1D through 3D, will not be described and illustrated. Accordingly, FIG. 27 illustrates Steps 4F through 5F, and FIG. 28 illustrates Steps 6F through 7F.

Step 4F

The third electrode 28V is formed onto the hole transport layer 3b after Step 3F. The third electrode 28V is formed so as to surround at least three sides of the perimeter of the hole transport layer 3b corresponding to each light-emitting portion (each of the red light-emitting portion 4R, green light-emitting portion 4G and blue light-emitting portion 4B). The third electrode 28V in the example of FIG. 27 surrounds the four sides of the perimeter of the hole transport layer 3b corresponding to each light-emitting portion.

Step 5F

The light-emitting layer 4 is formed onto the hole transport layer 3b and the third electrode 28V. The third electrode 28V according to the sixth embodiment surrounds the four sides of the perimeter of each light-emitting portion.

Step 6F

The fourth electrode 48V is formed onto the light-emitting layer 4. The fourth electrode 48V in the example of FIG. 28 has a shape similar to that of the third electrode 28V. That is, the fourth electrode 48V surrounds the four sides of the perimeter of each light-emitting portion. Nevertheless, the third electrode 28V and the fourth electrode 48V both need to surround at least three sides of the perimeter of each light-emitting portion.

The third electrode 28V and the fourth electrode 48V preferably have a thickness of 5 to 20 nm. It is noted that each of the third electrode 28V and fourth electrode 48V may have a plurality of linear portions (first linear portions and second linear portions) extending in parallel with each other. Each of the first linear portions and second linear portions in this case preferably has a width of 0.5 to 5 μm. The lower-limit value of the width, i.e. 0.5 μm, is a numeric value that is set in view of the manufacturability of the third electrode 28V and fourth electrode 48V. Further, the upper-limit value of the width, i.e. 5 μm, is a numeric value that is set in view of the aperture ratio (0.8) of each sub-pixel.

Step 7F

The electron transport layer 5b is formed onto the light-emitting layer 4 after the fourth electrode 48V is formed. The second electrode 6 is thereafter formed onto the electron transport layer 5b.

Seventh Embodiment

Figure 29:
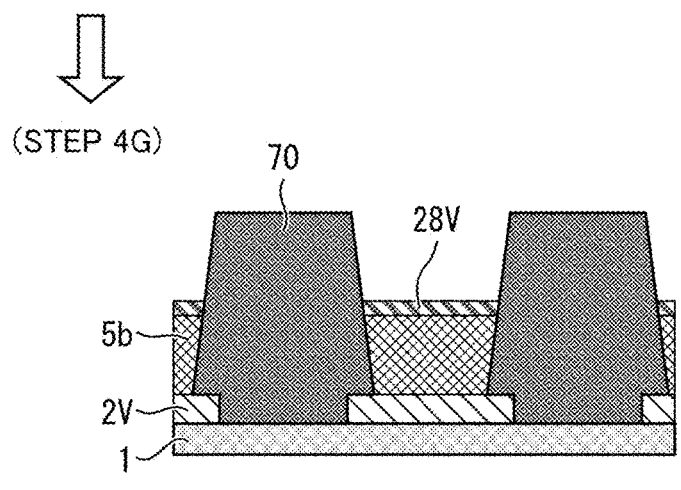
FIG. 29 illustrates process steps for manufacturing a light-emitting device according to a seventh embodiment.
Figure 29:
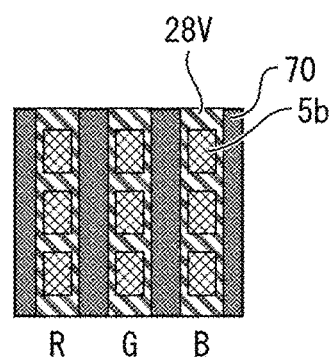
Figure 29:
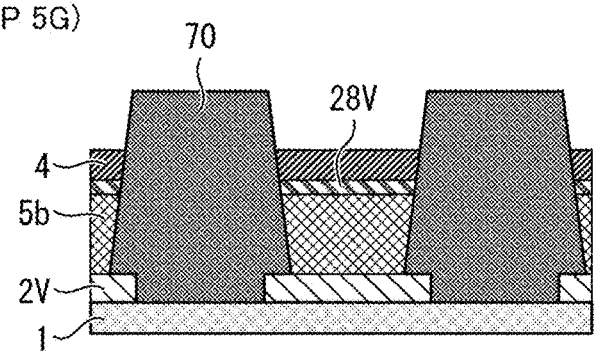
Figure 29:
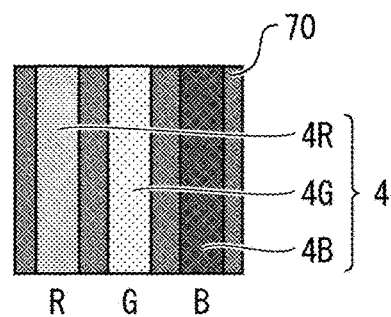
Figure 30:
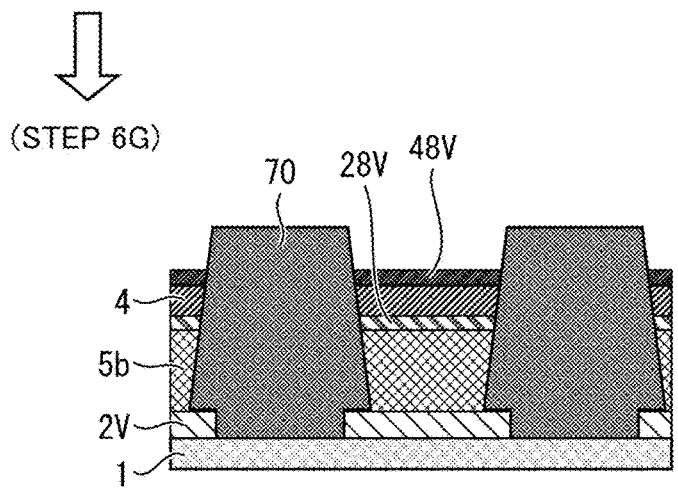
FIG. 30 illustrates process steps for manufacturing the light-emitting device according to the seventh embodiment.
Figure 30:
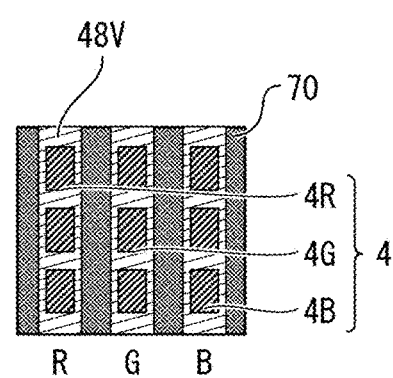
Figure 30:
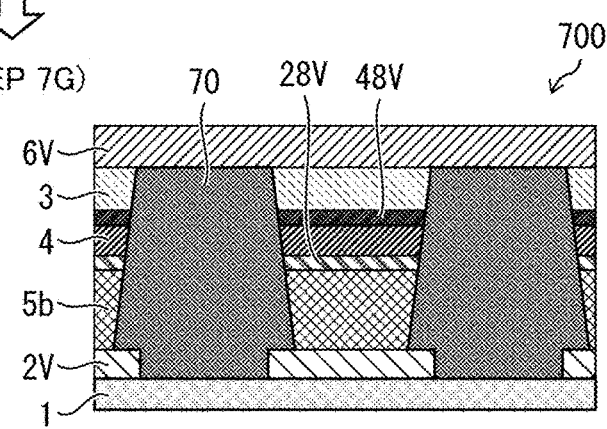
Figure 30:
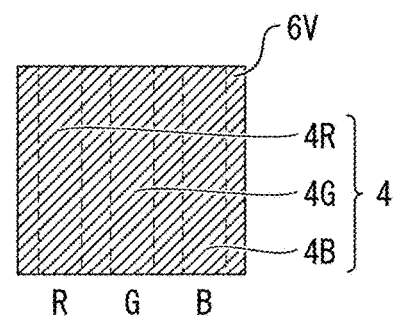

FIG. 29 and FIG. 30 illustrate process steps (Steps 1G through 7G) for manufacturing a light-emitting device 700 according to a seventh embodiment. The light-emitting device 700 is one modification of the light-emitting device 500. The light-emitting device 700 includes the third electrode 28V and the fourth electrode 48V instead of the third electrode 28 and the fourth electrode 48. The light-emitting device 700 has an effect similar to that of the light-emitting device 500.

Steps 1G through 3G, which are similar to Steps 1E through 3E will not be described and illustrated. Accordingly, FIG. 29 illustrates Steps 4G through 5G, and FIG. 30 illustrates Steps 6G through 7G.

Step 4G

The third electrode 28V is formed onto the electron transport layer 5b after Step 3G. The third electrode 28V in the example of FIG. 30 surrounds the four sides of the perimeter of the electron transport layer 5b corresponding to each light-emitting portion.

Step 5G

The light-emitting layer 4 is formed onto the electron transport layer 5b and the third electrode 28V. The third electrode 28V according to the seventh embodiment surrounds the four sides of the perimeter of each light-emitting portion.

Step 6G

This process step, which is similar to Step 6F described above, will not be described.

Step 7G

The hole injection/transport layer 3 is formed onto the light-emitting layer 4 after the fourth electrode 48V is formed. The second electrode 6V is thereafter formed onto the hole injection/transport layer 3.

SUMMARY

A light-emitting device according to a first aspect includes the following: a first electrode, a light-emitting layer, and a second electrode disposed in the order recited; a charge transport layer disposed between the first electrode and the light-emitting layer and/or between the second electrode and the light-emitting layer; a third electrode provided so as to at least partly overlap the light-emitting layer, wherein the third electrode is disposed between the charge transport layer and the light-emitting layer.

In the light-emitting device according to a second aspect, the third electrode is in contact with the light-emitting layer.

In the light-emitting device according to a third aspect, the light-emitting layer has a first light-emitting portion, a second light-emitting portion, and a third light-emitting portion, one of the first light-emitting portion, the second light-emitting portion and the third light-emitting portion that has a maximum aspect ratio is defined as a particular light-emitting portion, a direction intersecting with the longer-side direction of the particular light-emitting portion is defined as a first direction, at least two of the first light-emitting portion, the second light-emitting portion and the third light-emitting portion are repeatedly arranged in the first direction, and the third electrode is formed in the first direction so as to cross the at least two light-emitting portions.

In the light-emitting device according to a fourth aspect, the first light-emitting portion, the second light-emitting portion, and the third light-emitting portion are repeatedly arranged in the first direction in the order recited, and the third electrode is formed in the first direction so as to cross the first light-emitting portion, the second light-emitting portion, and the third light-emitting portion.

The light-emitting device according to a fifth aspect further includes a bank formed so as to separate the first light-emitting portion, the second light-emitting portion, and the third light-emitting portion, wherein the third electrode is formed so as to cover at least a part of the bank between the first light-emitting portion and the second light-emitting portion, between the second light-emitting portion and the third light-emitting portion, and between the third light-emitting portion and the first light-emitting portion.

In the light-emitting device according to a sixth aspect, the light-emitting layer has a first light-emitting portion, a second light-emitting portion, and a third light-emitting portion, one of the first light-emitting portion, the second light-emitting portion and the third light-emitting portion that has a maximum aspect ratio is defined as a particular light-emitting portion, a direction intersecting with the longer-side direction of the particular light-emitting portion is defined as a first direction, the first light-emitting portion, the second light-emitting portion, and the third light-emitting portion are repeatedly arranged in the first direction in the order recited, a plurality of the first light-emitting portions are repeatedly arranged in a second direction intersecting with the first direction, a plurality of the second light-emitting portions are repeatedly arranged in the second direction, and a plurality of the third light-emitting portions are repeatedly arranged in the second direction, and the third electrode is formed in the second direction so as to cross the plurality of first light-emitting portions, the plurality of second light-emitting portions, and the plurality of third light-emitting portions.

The light-emitting device according to a seventh aspect further includes a bank formed so as to separate the first light-emitting portion, the second light-emitting portion, and the third light-emitting portion, wherein the third electrode is formed so as to cover at least a part of the bank between the plurality of first light-emitting portions, between the plurality of second light-emitting portions, and between the plurality of third light-emitting portions.

In the light-emitting device according to an eighth aspect, the third electrode and the charge transport layer are disposed on the light-emitting layer adjacent to the first electrode.

In the light-emitting device according to a ninth aspect, the third electrode and the charge transport layer are disposed on the light-emitting layer adjacent to the second electrode.

In the light-emitting device according to a tenth aspect, the third electrode is composed of a compound containing at least $TiO_2$ or AZO.

In the light-emitting device according to an eleventh aspect, the third electrode has a thickness of 5 to 20 nm inclusive.

In the light-emitting device according to a twelfth aspect, the third electrode is linearly formed over a part of the light-emitting layer.

In the light-emitting device according to a thirteenth aspect, the third electrode is composed of a compound containing at least $TiO_2$ or AZO, is composed of at least one metal among gold, platinum, silver, cobalt, nickel, titanium, aluminum and chromium or is composed of an alloy of the at least one metal.

In the light-emitting device according to a fourteenth aspect, the third electrode has a plurality of linear portions extending in parallel with each other, and the plurality of linear portions have a width of 0.5 to 20 μm inclusive, and a thickness of 5 to 20 nm inclusive.

A light-emitting device according to a fifteenth aspect includes the following: a first electrode, a light-emitting layer, and a second electrode disposed in the order recited;

a charge transport layer disposed between the first electrode and the light-emitting layer and/or between the second electrode and the light-emitting layer; a third electrode formed so as to at least partly overlap the light-emitting layer; a circuit for electrically connecting together a power source for driving the light-emitting layer, the first electrode, and the second electrode; a first switch for opening or closing the circuit; and a second switch for opening or closing an electrical connection between the third electrode and the circuit.

In the light-emitting device according to a sixteenth aspect, the first switch and the second switch are alternately changed at a frequency of 40 Hz or greater.

In the light-emitting device according to a seventeenth aspect, the third electrode is in contact with the light-emitting layer.

In the light-emitting device according to an eighteenth aspect, the light-emitting layer has a first light-emitting portion, a second light-emitting portion, and a third light-emitting portion, one of the first light-emitting portion, the second light-emitting portion and the third light-emitting portion that has a maximum aspect ratio is defined as a particular light-emitting portion, a direction intersecting with the longer-side direction of the particular light-emitting portion is defined as a first direction, at least two of the first light-emitting portion, the second light-emitting portion and the third light-emitting portion are repeatedly arranged in the first direction, and the third electrode is formed in the first direction so as to cross the at least two light-emitting portions.

In the light-emitting device according to a nineteenth aspect, the first light-emitting portion, the second light-emitting portion, and the third light-emitting portion are repeatedly arranged in the first direction in the order recited, and the third electrode is formed in the first direction so as to cross the first light-emitting portion, the second light-emitting portion, and the third light-emitting portion.

The light-emitting device according to a twentieth aspect further includes a bank formed so as to separate the first light-emitting portion, the second light-emitting portion, and the third light-emitting portion, wherein the third electrode is formed so as to cover at least a part of the bank between the first light-emitting portion and the second light-emitting portion, between the second light-emitting portion and the third light-emitting portion, and between the third light-emitting portion and the first light-emitting portion.

In the light-emitting device according to a twenty-first aspect, the light-emitting layer has a first light-emitting portion, a second light-emitting portion, and a third light-emitting portion, one of the first light-emitting portion, the second light-emitting portion and the third light-emitting portion that has a maximum aspect ratio is defined as a particular light-emitting portion, a direction intersecting with the longer-side direction of the particular light-emitting portion is defined as a first direction, the first light-emitting portion, the second light-emitting portion, and the third light-emitting portion are repeatedly arranged in the first direction in the order recited, a plurality of the first light-emitting portions are repeatedly arranged in a second direction intersecting with the first direction, a plurality of the second light-emitting portions are repeatedly arranged in the second direction, and a plurality of the third light-emitting portions are repeatedly arranged in the second direction, and the third electrode is formed in the second direction so as to cross the plurality of first light-emitting portions, the plurality of second light-emitting portions, and the plurality of third light-emitting portions.

The light-emitting device according to a twenty-second aspect further includes a bank formed so as to separate the first light-emitting portion, the second light-emitting portion, and the third light-emitting portion, wherein the third electrode is formed so as to cover at least a part of the bank between the plurality of first light-emitting portions, between the plurality of second light-emitting portions, and between the plurality of third light-emitting portions.

In the light-emitting device according to a twenty-third aspect, the third electrode and the charge transport layer are disposed on the light-emitting layer adjacent to the first electrode.

In the light-emitting device according to a twenty-fourth aspect, the third electrode and the charge transport layer are disposed on the light-emitting layer adjacent to the second electrode.

In the light-emitting device according to a twenty-fifth aspect, the third electrode is composed of a compound containing at least $TiO_2$ or AZO.

In the light-emitting device according to a twenty-sixth aspect, the third electrode has a thickness of 5 to 20 nm inclusive.

In the light-emitting device according to a twenty-seventh aspect, the third electrode is linearly formed over a part of the light-emitting layer.

In the light-emitting device according to a twenty-eighth aspect, the third electrode is composed of a compound containing at least $TiO_2$ or AZO, is composed of at least one metal among gold, platinum, silver, cobalt, nickel, titanium, aluminum and chromium or is composed of an alloy of the at least one metal.

In the light-emitting device according to a twenty-ninth aspect, the third electrode has a plurality of linear portions extending in parallel with each other, and the plurality of linear portions have a width of 0.5 to 20 μm inclusive, and a thickness of 5 to 20 nm inclusive.

In the light-emitting device according to a thirtieth aspect, the third electrode is disposed between the charge transport layer and the light-emitting layer on the first electrode, and the light-emitting device further includes a fourth electrode disposed between the charge transport layer and the light-emitting layer on the second electrode.

In the light-emitting device according to a thirty-first aspect, the light-emitting layer has a first light-emitting portion, a second light-emitting portion, and a third light-emitting portion, one of the first light-emitting portion, the second light-emitting portion and the third light-emitting portion that has a maximum aspect ratio is defined as a particular light-emitting portion, a direction intersecting with the longer-side direction of the particular light-emitting portion is defined as a first direction, the first light-emitting portion, the second light-emitting portion, and the third light-emitting portion are repeatedly arranged in the first direction in the order recited, the light-emitting device further includes a bank formed in a second direction intersecting with the first direction so as to separate a plurality of first light-emitting portions repeatedly arranged in the second direction, a plurality of second light-emitting portions repeatedly arranged in the second direction, and a plurality of third light-emitting portions repeatedly arranged in the second direction, and the third electrode and the fourth electrode are linearly formed along the bank and over a part of the light-emitting layer.

In the light-emitting device according to a thirty-second aspect, the third electrode and the fourth electrode are composed of at least one metal among gold, platinum, silver, cobalt, nickel, titanium, aluminum and chromium or is composed of an alloy of the at least one metal.

In the light-emitting device according to a thirty-third aspect, the third electrode and the fourth electrode have a thickness of 5 to 20 nm inclusive.

In the light-emitting device according to a thirty-fourth aspect, the third electrode and the fourth electrode have a plurality of first linear portions and a plurality of second linear portions extending in parallel with each other, and the plurality of first linear portions and the plurality of second linear portions have a width of 0.5 to 20 µm inclusive.

In the light-emitting device according to a thirty-fifth aspect, the light-emitting layer has a first light-emitting portion, a second light-emitting portion, and a third light-emitting portion, and the third electrode and the fourth electrode are provided so as to surround at least three sides of the perimeter of the first light-emitting portion, the second light-emitting portion and the third light-emitting portion.

In the light-emitting device according to a thirty-sixth aspect, the third electrode and the fourth electrode have a plurality of first linear portions and a plurality of second linear portions extending in parallel with each other, and the plurality of first linear portions and the plurality of second linear portions have a width of 0.5 to 5 µm inclusive.

A light-emitting device according to a thirty-seventh aspect includes the following: a first electrode, a light-emitting layer, and a second electrode disposed in the order recited; a charge transport layer disposed between the first electrode and the light-emitting layer and/or between the second electrode and the light-emitting layer; a third electrode and a fourth electrode provided so as to at least partly overlap the light-emitting layer, the third electrode being disposed between the charge transport layer and the light-emitting layer on the first electrode, the fourth electrode being disposed between the charge transport layer and the light-emitting layer on the second electrode; a circuit for electrically connecting together a power source for driving the light-emitting layer, the first electrode, and the second electrode; a first switch for opening or closing the circuit; and a second switch for opening or closing an electrical connection between the third electrode and the fourth electrode.

In the light-emitting device according to a thirty-eighth aspect, the first switch and the second switch are alternately changed at a frequency of 40 Hz or greater.

In the light-emitting device according to a thirty-ninth aspect, the light-emitting layer has a first light-emitting portion, a second light-emitting portion, and a third light-emitting portion, one of the first light-emitting portion, the second light-emitting portion and the third light-emitting portion that has a maximum aspect ratio is defined as a particular light-emitting portion, a direction intersecting with the longer-side direction of the particular light-emitting portion is defined as a first direction, the first light-emitting portion, the second light-emitting portion, and the third light-emitting portion are repeatedly arranged in the first direction in the order recited, the light-emitting device further includes a bank formed in a second direction intersecting with the first direction so as to separate a plurality of first light-emitting portions repeatedly arranged in the second direction, a plurality of second light-emitting portions repeatedly arranged in the second direction, and a plurality of third light-emitting portions repeatedly arranged in the second direction, and the third electrode and the fourth electrode are linearly formed along the bank and over a part of the light-emitting layer.

In the light-emitting device according to a fortieth aspect, the third electrode and the fourth electrode are composed of at least one metal among gold, platinum, silver, cobalt, nickel, titanium, aluminum and chromium or is composed of an alloy of the at least one metal.

In the light-emitting device according to a forty-first aspect, the third electrode and the fourth electrode have a thickness of 5 to 20 nm inclusive.

In the light-emitting device according to a forty-second aspect, the third electrode and the fourth electrode have a plurality of first linear portions and a plurality of second linear portions extending in parallel with each other, and the plurality of first linear portions and the plurality of second linear portions have a width of 0.5 to 20 µm inclusive.

In the light-emitting device according to a forty-third aspect, the light-emitting layer has a first light-emitting portion, a second light-emitting portion, and a third light-emitting portion, and the third electrode and the fourth electrode are provided so as to surround at least three sides of the perimeter of the first light-emitting portion, the second light-emitting portion and the third light-emitting portion.

In the light-emitting device according to a forty-fourth aspect, the third electrode and the fourth electrode have a plurality of first linear portions and a plurality of second linear portions extending in parallel with each other, and the plurality of first linear portions and the plurality of second linear portions have a width of 0.5 to 5 µm inclusive.

A forty-fifth aspect provides a method for driving a light-emitting device including a first electrode, a light-emitting layer, and a second electrode disposed in the order recited, the light-emitting device including a charge transport layer disposed between the first electrode and the light-emitting layer and/or between the second electrode and the light-emitting layer, the light-emitting device including a third electrode formed so as to at least partly overlap the light-emitting layer, the light-emitting device including a circuit for electrically connecting together a power source for driving the light-emitting layer, the first electrode, and the second electrode, the method including the following: a first step of opening or closing the circuit, and a second step of opening or closing an electrical connection between the third electrode and the circuit.

The method for driving the light-emitting device according to a forty-sixth aspect is configured such that the first step and the second step are executed while being switched at a frequency of 40 Hz or greater.

A forty-seventh aspect provides a method for driving a light-emitting device including a first electrode, a light-emitting layer, and a second electrode disposed in the order recited, the light-emitting device including a charge transport layer disposed between the first electrode and the light-emitting layer and/or between the second electrode and the light-emitting layer, the light-emitting device including a third electrode and a fourth electrode provided so as to at least partly overlap the light-emitting layer, the third electrode being disposed between the charge transport layer and the light-emitting layer on the first electrode, the fourth electrode being disposed between the charge transport layer and the light-emitting layer on the second electrode, the light-emitting device including a circuit for electrically connecting together a power source for driving the light-emitting layer, the first electrode, and the second electrode, the method including the following: a first step of opening or closing the circuit; and a third step of opening or closing an electrical connection between the third electrode and the fourth electrode.

The method for driving the light-emitting device according to a forty-eighth aspect is configured such that the first step and the third step are executed while being switched at a frequency of 40 Hz or greater.

Additional Note

One aspect of the present disclosure is not limited to the foregoing embodiments. Various modifications can be devised within the scope of the claims. An embodiment that is obtained in combination, as appropriate, with the technical means disclosed in the respective embodiments is also included in the technical scope of one aspect of the disclosure. Furthermore, combining the technical means disclosed in the respective embodiments can form a new technical feature.

The invention claimed is:

1. A light-emitting device comprising:
 a first electrode, a light-emitting layer, and a second electrode disposed in this recited order;
 a charge transport layer disposed between the first electrode and the light-emitting layer or between the second electrode and the light-emitting layer; and
 a third electrode provided, such that to, at least partly, overlap the light-emitting layer,
 wherein the third electrode is disposed between the charge transport layer and the light-emitting layer,
 the light-emitting layer has a first light-emitting portion, a second light-emitting portion, and a third light-emitting portion,
 one of the first light-emitting portion, the second light-emitting portion, and the third light-emitting portion, having a maximum aspect ratio, is defined as a particular light-emitting portion, an aspect ratio being a ratio of a length of a longer side to a length of a shorter side of the particular light-emitting portion,
 a direction intersecting with a longer-side direction of the particular light-emitting portion is defined as a first direction,
 at least two of the first light-emitting portion, the second light-emitting portion, and the third light-emitting portion are repeatedly arranged in the first direction, and
 the third electrode is formed in the first direction, such that to cross the at least two of the first light-emitting portion, the second light-emitting portion, and the third light-emitting portion.

2. The light-emitting device according to claim 1, wherein
 the first light-emitting portion, the second light-emitting portion, and the third light-emitting portion are repeatedly arranged in the first direction in this recited order, and
 the third electrode is formed in the first direction, such that to cross the first light-emitting portion, the second light-emitting portion, and the third light-emitting portion.

3. The light-emitting device according to claim 1, further comprising a bank formed, such that to separate the first light-emitting portion, the second light-emitting portion, and the third light-emitting portion,
 wherein the third electrode is formed, such that to cover at least a part of the bank between the first light-emitting portion and the second light-emitting portion, between the second light-emitting portion and the third light-emitting portion, and between the third light-emitting portion and the first light-emitting portion.

4. The light-emitting device according to claim 1, wherein the third electrode and the charge transport layer are disposed on the light-emitting layer adjacent to the first electrode.

5. The light-emitting device according to claim 1, wherein the third electrode and the charge transport layer are disposed on the light-emitting layer adjacent to the second electrode.

6. The light-emitting device according to claim 1, wherein the third electrode has a thickness of 5 to 20 nm inclusive.

7. The light-emitting device according to claim 1, wherein the third electrode is linearly formed over a part of the light-emitting layer.

8. The light-emitting device according to claim 1, wherein the third electrode is a compound including a metal element containing at least gold, platinum, silver, cobalt, nickel, titanium, aluminum, and chromium.

9. The light-emitting device according to claim 1, wherein
 the third electrode has a plurality of linear portions extending in parallel with each other, and
 the plurality of linear portions has a width of 0.5 to 20 µm, inclusive, and a thickness of 5 to 20 nm, inclusive.

10. A light-emitting device comprising:
 a first electrode, a light-emitting layer, and a second electrode disposed in this recited order;
 a charge transport layer disposed between the first electrode and the light-emitting layer or between the second electrode and the light-emitting layer;
 a third electrode provided, such that to, at least partly, overlap the light-emitting layer;
 a circuit configured to connect electrically together a power source for driving the light-emitting layer, the first electrode, and the second electrode;
 a first switch configured to open or close the circuit; and
 a second switch configured to open or close an electrical connection between the third electrode and the circuit.

11. The light-emitting device according to claim 10, wherein the first switch and the second switch are alternately changed at a frequency of 40 Hz or greater.

12. The light-emitting device according to claim 10, wherein
 the light-emitting layer has a first light-emitting portion, a second light-emitting portion, and a third light-emitting portion,
 one of the first light-emitting portion, the second light-emitting portion, and the third light-emitting portion, having a maximum aspect ratio, is defined as a particular light-emitting portion, an aspect ratio being a ratio of a length of a longer side to a length of a shorter side of the particular light-emitting portion,
 a direction intersecting with a longer-side direction of the particular light-emitting portion is defined as a first direction,
 at least two of the first light-emitting portion, the second light-emitting portion, and the third light-emitting portion are repeatedly arranged in the first direction,
 the third electrode is formed in the first direction, such that to cross the at least two of the first light-emitting portion, the second light-emitting portion, and the third light-emitting portion,
 the light-emitting device further comprises a bank formed, such that to separate the first light-emitting portion, the second light-emitting portion, and the third light-emitting portion, and
 the third electrode is formed, such that to cover at least a part of the bank between the first light-emitting portion and the second light-emitting portion, between the second light-emitting portion and the third light-emitting portion, and between the third light-emitting portion and the first light-emitting portion.

13. The light-emitting device according to claim 10, wherein
the light-emitting layer has a first light-emitting portion, a second light-emitting portion, and a third light-emitting portion,
one of the first light-emitting portion, the second light-emitting portion and the third light-emitting portion, having a maximum aspect ratio, is defined as a particular light-emitting portion, an aspect ratio being a ratio of a length of a longer side to a length of a shorter side of the particular light-emitting portion,
a direction intersecting with a longer-side direction of the particular light-emitting portion is defined as a first direction,
the first light-emitting portion, the second light-emitting portion, and the third light-emitting portion are repeatedly arranged in the first direction in this recited order,
a plurality of first light-emitting portions, including the first light-emitting portion, is repeatedly arranged in a second direction intersecting with the first direction, a plurality of second light-emitting portions, including the second light-emitting portion, is repeatedly arranged in the second direction, and a plurality of third light-emitting portions, including the third light-emitting portion, is repeatedly arranged in the second direction, and
the third electrode is formed in the second direction, such that to cross the plurality of first light-emitting portions, the plurality of second light-emitting portions, and the plurality of third light-emitting portions.

14. The light-emitting device according to claim 13, further comprising a bank formed, such that to separate the first light-emitting portion, the second light-emitting portion, and the third light-emitting portion,
wherein the third electrode is formed, such that to cover at least a part of the bank between the plurality of first light-emitting portions, between the plurality of second light-emitting portions, and between the plurality of third light-emitting portions.

15. A light-emitting device comprising:
a first electrode, a light-emitting layer, and a second electrode disposed in this recited order;
a charge transport layer disposed between the first electrode and the light-emitting layer or between the second electrode and the light-emitting layer;
a third electrode and a fourth electrode provided, such that at least partly, overlap the light-emitting layer,
the third electrode being disposed between the charge transport layer and the light-emitting layer on the first electrode,
the fourth electrode being disposed between the charge transport layer and the light-emitting layer on the second electrode;
a circuit configured to connect electrically together a power source for driving the light-emitting layer, the first electrode, and the second electrode;
a first switch configured to open or close the circuit; and
a second switch configured to open or close an electrical connection between the third electrode and the fourth electrode.

16. The light-emitting device according to claim 15, wherein
the light-emitting layer has a first light-emitting portion, a second light-emitting portion, and a third light-emitting portion,
one of the first light-emitting portion, the second light-emitting portion, and the third light-emitting portion, having a maximum aspect ratio, is defined as a particular light-emitting portion, an aspect ratio being a ratio of a length of a longer side to a length of a shorter side of the particular light-emitting portion,
a direction intersecting with a longer-side direction of the particular light-emitting portion is defined as a first direction,
the first light-emitting portion, the second light-emitting portion, and the third light-emitting portion are repeatedly arranged in the first direction in this recited order,
the light-emitting device further comprises a bank formed in a second direction intersecting with the first direction, such that to separate a plurality of first light-emitting portions, including the first light-emitting portion, repeatedly arranged in the second direction, a plurality of second light-emitting portions, including the second light-emitting portion, repeatedly arranged in the second direction, and a plurality of third light-emitting portions, including the third light-emitting portion, repeatedly arranged in the second direction, and
the third electrode and the fourth electrode are linearly formed along the bank and over a part of the light-emitting layer.

17. The light-emitting device according to claim 15, wherein
the light-emitting layer has a first light-emitting portion, a second light-emitting portion, and a third light-emitting portion, and
the third electrode and the fourth electrode are provided, such that to surround at least three sides of a perimeter of the first light-emitting portion, the second light-emitting portion, and the third light-emitting portion.

* * * * *